United States Patent
Lee

(10) Patent No.: US 7,212,449 B2
(45) Date of Patent: May 1, 2007

(54) DATA OUTPUT DEVICE OF SEMICONDUCTOR MEMORY DEVICE

(75) Inventor: Chang-Hyuk Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/322,078

(22) Filed: Dec. 30, 2005

(65) Prior Publication Data

US 2007/0070713 A1  Mar. 29, 2007

(30) Foreign Application Priority Data

Sep. 29, 2005  (KR) ...................... 10-2005-0091652

(51) Int. Cl.
*G11C 11/34*  (2006.01)

(52) U.S. Cl. .............................. 365/189.05; 365/230.02

(58) Field of Classification Search ........... 365/189.05, 365/230.02
See application file for complete search history.

(56) References Cited

U.S. PATENT DOCUMENTS

| | | |
|---|---|---|
| 5,553,024 A | 9/1996 | Furuyama |
| 5,914,899 A | 6/1999 | Suematsu |
| 6,724,684 B2 | 4/2004 | Kim |
| 2004/0076039 A1 | 4/2004 | Chung et al. |
| 2004/0081013 A1 | 4/2004 | Lee et al. |
| 2005/0271085 A1* | 12/2005 | Lee ............................. 370/468 |
| 2006/0085703 A1* | 4/2006 | Lee ............................. 714/718 |
| 2006/0133158 A1* | 6/2006 | Shin ....................... 365/189.05 |

FOREIGN PATENT DOCUMENTS

| | | |
|---|---|---|
| JP | 6-203563 | 7/1994 |
| JP | 9-306168 | 11/1997 |
| JP | 2004-139718 | 5/2004 |
| JP | 2005-004954 | 1/2005 |

\* cited by examiner

*Primary Examiner*—Michael Tran
(74) *Attorney, Agent, or Firm*—McDermott Will & Emery LLP

(57) ABSTRACT

There is provided a data output device for stably operating in a high frequency circumstance. The data output device includes a selection unit for receiving a second address information signal to directly output or inversely output the received signal as a third address information signal in response to a first address information signal; a pipe output control unit for generating a plurality of pipe output control signals; a plurality of pipe latch units for storing a global data in response to a pipe input control signal and aligning the stored data in response to the first to the third address information signals, thereby outputting the aligned data synchronized by the pipe output control signals; and a data driving unit for outputting the aligned data as an external data in response to a first and a second DLL output clock.

20 Claims, 13 Drawing Sheets

DATA OUTPUT DEVICE OF SEMICONDUCTOR MEMORY DEVICE

FIELD OF THE INVENTION

The present invention relates to a data output device of a semiconductor memory device; and, more particularly, to a data output device for stably operating in a high frequency circumstance.

DESCRIPTION OF THE RELATED ARTS

In general, in a double data rate synchronous dynamic random access memory (hereinafter, referring to a DDR SDRAM), a rising and a falling edges of a clock signal are used when reading data out of cells or writing data in cells.

The DDR SDRAM can receive continuously commands from an external, but the DDR SDRAM cannot perform directly the inputted commands. In case of a read operation, to activate a read CAS signal for performing the read operation, the DDR SDRAM secures a time for continuously performing an inputted read command by delaying an activating point of the read CAS signal. In this time, an additive latency (hereinafter, referring to an AL) means a delay time until the read CAS signal is activated by the inputted read command. Also, a CAS latency (hereinafter, referring to a CL) means a time until a valid data is outputted in response to the read CAS signal activated by the AL. A read latency (hereinafter, referring to a RL) means a time from that the read command is inputted to that the valid data is outputted. That is, the read latency becomes a (AL+CL).

In the mean time, an output data having a plurality of bits is outputted by once read command. The number of bits of the output data is determined by setting a burst length (hereinafter, referring to a BL) of a mode register set (hereinafter, referring to an MRS). A sequence of the output data is also determined by setting the BL of the MRS. The sequence of the output data is classified into an interleave mode and a sequential mode according to the BL of the MRS.

Hereinafter, a process that the output data outputted from a memory block is aligned by the BL of the MRS after the read command is inputted and then the output data is outputted in response to a DLL output clock is described in detail.

FIG. 1 is a block diagram showing a conventional data output device of a semiconductor memory device.

As shown, the conventional data output device of a semiconductor memory device includes a pipe latch output control unit 50, a pipe latch unit 60, a data driving unit 70 and a data align control unit 80.

Herein, the data align control unit 80 receives a burst-type selection signal SEQBINT, a first address information signal SOSEB0 and a second address information signal SOSEB1_R to output a first alignment control signal SOSEB1_R<0:3>, a second alignment control signal SOSEB1_F<0:3> and a clock-edge selection signal SOSEB0<0:3>. The pipe latch output control unit 50 generates a first and a second pipe output control signals RPOUT<0:3> and FPOUT<0:3> in response to a read CAS signal CASP6_RD. The pipe latch unit 60 saves a global data GIO_Q<0:3> in response to a pipe input control signal PIN<0:3> and align the saved data in response to the first alignment control signal SOSEB1_R<0:3>, the second alignment control signal SOSEB1_F<0:3> and the clock-edge selection signal SOSEB0<0:3> to thereby output the aligned data as a first and a second output data RDO and FDO in synchronization with the first and the second pipe output control signals RPOUT<0:3> and FPOUT<0:3>. The data driving unit 70 receives the first and the second output data RDO and FDO to output the received data as an external data DQ in response to a first and a second DLL output clocks RCLK_DO and FCLK_DO.

The pipe latch unit 60 includes a first to a fourth pipe latch units 62, 64, 66 and 66.

The data align control unit 80 includes a selection unit 10, a first alignment control signal generating unit 20, a second alignment control signal generating unit 30 and a clock-edge selection signal generating unit 40.

The selection unit 10 receives the second address information signal SOSEB1_R to directly output or inversely output the received signal as a third address information signal SOSEB1_F in response to the burst-type selection signal SEQBINT and the first address information signal SOSEB0. The first alignment control signal generating unit 20 receives the second address align information signal SOSEB1_R to output the received data as the first alignment control signal SOSEB1_R<0:3> in response to a second column-cycle information signal S<0:3>. The second alignment control signal generating unit 30 receives the third address information signal SOSEB1_F to output the received signal as the second alignment control signal SOSEB1_F<0:3> in synchronization with the second column-cycle information signal S<0:3> and a DLL rising clock RCLK_DLL. The clock-edge selection signal generating unit 40 receives the first address information signal SOSEB0 to output the received signal as the clock-edge selection signal SOSEB0<0:3> in synchronization with a first column-cycle information signal SS<0:3>.

For reference, the semiconductor memory device generates the DLL rising clock RCLK_DLL in synchronization with a rising edge of an external clock CLK in consideration of an internal delay, so as to synchronizing an output data outputted from an internal with the external clock CLK. Likewise, the semiconductor memory device generates a DLL falling clock FCLK_DLL in synchronization with a falling edge of the external clock CLK in consideration of the internal delay. Then, the semiconductor memory device performs an internal operation in response to the DLL rising clock RCLK_DLL and the DLL falling clock FCLK_DLL.

FIG. 2 is a circuit diagram showing the selection unit 20 10 as shown in FIG. 1.

As shown, the selection unit 10 outputs an inverted second address information signal as the third address information signal SOSEB1_F when the burst-type selection signal SEQBINT is in a logic level 'LOW' and the first address information signal SOSEB0 is in a logic level 'HIGH'. Otherwise, the selection unit 10 outputs the second address information signal SOSEB1_R as the third address information signal SOSEB1_F.

For reference, the first address information signal SOSEB0 denotes a least significant bit (LSB) of a column address inputted together with a read command. The second address information signal SOSEB1_R denotes a second LSB of the column address and the burst-type selection signal SEQBINT is determined by a MRS.

FIG. 3 is a circuit diagram showing the first alignment control signal generating unit 20 as shown in FIG. 1.

As shown, the first alignment control signal generating unit 20 includes a first to a fourth synchronizing units 22, 24, 26 and 28 for outputting the second address information signal SOSEB1_R outputted from the selection unit 10 as the first alignment control signal SOSEB1_R<0:3> in response to the second column-cycle information signal S<0:3>.

Each of the first to the fourth synchronizing units 22, 24, 26 and 28 has a same structure. The first synchronizing unit 22 is explained as an example as shown in FIG. 4.

FIG. 5 is a waveform diagram illustrating an operation of the first alignment control signal generating unit 20 shown in FIG. 3.

As shown, first, when the read CAS signal CASP6_RD is activated after the read command is inputted, the second LSB of the column address inputted together with the read command is applied to the second address information signal SOSEB1_R in synchronization with the DLL falling clock FCLK_DLL corresponding to a (RL−1). Then, the second address information signal SOSEB1_R is changed by a one-clock unit.

Also, when the read command is inputted, a first bit S<0> of the second column-cycle information signal S<0:3> is activated with a logic level 'HIGH' and a second to a fourth bits S<1:3> of the second column-cycle information signal S<0:3> are inactivated with a logic level 'LOW'. Then, in synchronization with the DLL rising clock RCLK_DLL corresponding to a (RL+1), the first bit S<0> of the second column-cycle information signal S<0:3> is inactivated with the logic level 'LOW' and the second bit S<1> of the second column-cycle information signal S<0:3> is activated with the logic level 'HIGH'. Continuously, in synchronization with the DLL rising clock RCLK_DLL corresponding to a (RL+3), the second bit S<1> of the second column-cycle information signal S<0:3> is inactivated with the logic level 'LOW' and the third bit S<2> of the second column-cycle information signal S<0:3> is activated with the logic level 'HIGH'.

As described above, the second column-cycle information signal S<0:3> is sequentially activated by a two-clock unit. When a gabless read operation, i.e., the read command is continuously applied, the second column-cycle information signal S<0:3> keeps on being sequentially activated from the first bit S<0> to the fourth bit S<3>.

In detail, the first alignment control signal generating unit 20 outputs the second address information signal SOSEB1_R as the first alignment control signal SOSEB1_R<0:3> in response to an activation of each corresponding bit of second column-cycle information signal S<0:3>. Namely, when the first bit S<0> of the second column-cycle information signal S<0:3> is activated, the second address information signal SOSEB1_R is outputted as a first bit SOSEB1_R<0> of the first alignment control signal SOSEB1_R<0:3>. Also, when the second bit S<1> of the second column-cycle information signal S<0:3> is activated, the second address information signal SOSEB1_R is outputted as a second bit SOSEB1_R<1> of the first alignment control signal SOSEB1_R<0:3>. Accordingly, each bit of the first alignment control signal SOSEB1_R<0:3> sequentially has a valid data by a two-clock unit from the DLL falling clock FCLK_DLL corresponding to the (RL−1).

For reference, in the data output device of the present invention, it is assumed that an AL is set to 0, a CL is set to 3 and a BL is set to 8. Accordingly, the second address information signal SOSEB1_R is converted during 4 clocks which correspond to a half of the BL.

FIG. 6 is a circuit diagram showing the second alignment control signal generating unit 30 as shown in FIG. 1.

As shown, the second alignment control signal generating unit 30 includes a fifth to an eighth synchronizing units 31, 32, 33 and 34, and a first to a fourth half-clock shift units 35, 36, 37 and 38.

The fifth to the eighth synchronizing units 31, 32, 33 and 34 receive the second address information signal SOSEB1_R outputted from the selection unit 10 to output the received signal as a first to a fourth intermediate signals IN1, IN2, IN3 and IN4 in response to the second column-cycle information signal S<0:3>. The first to the fourth half-clock shift units 35, 36, 37 and 38 receive the first to the fourth intermediate signals IN1, IN2, IN3 and IN4 to output the received signals as the second alignment control signal SOSEB1_F<0:3> in response to the rising clock DLL rising clock RCLK_DLL.

Each of the fifth to the eighth synchronizing units 31, 32, 33 and 34 has the same structure as the first synchronizing unit 22 as described in FIG. 4. Also, each of the first to the fourth half-clock shift units 35, 36, 37 and 38 has a same structure. The first half-clock shift unit 35 is explained as an example as shown in FIG. 7.

FIG. 7 is a circuit diagram showing the first half-clock shift unit 35 as shown in FIG. 6.

As shown, the first half-clock shift unit 35 includes a first transfer gate T1, an inverter latch LAT1 and a first inverter IV1.

The first transfer gate T1 transmits the first intermediate signal IN1 in synchronization with the DLL rising clock RCLK_DLL. The inverter latch LAT1 latches a signal transmitted by the first transfer gate T1 in response to the DLL rising clock RCLK_DLL. The first inverter IV1 inverts an output of the inverter latch LAT1 to thereby output the latched signal as a first bit SOSEB1_F<0> of the second alignment control signal SOSEB1_F<0:3>.

As described in FIGS. 6 and 7, the second alignment control signal generating unit 30 generates the first to the fourth intermediate signals IN1, IN2, IN3 and IN4 having a valid data related with the third address information signal SOSEB1_F outputted from the selection unit 10 only when the second column-cycle information signal S<0:3> is activated. Then, the second alignment control signal generating unit 30 outputs the first to the fourth intermediate signals IN1, IN2, IN3 and IN4 as the second alignment control signal SOSEB1_F<0:3> in synchronization with the DLL rising clock RCLK_DLL which is activated after a half-clock.

Accordingly, each bit of the second alignment control signal SOSEB1_F<0:3> has sequentially an effective data by a two-clock unit from the DLL rising clock RCLK_DLL corresponding to the RL. At this time, the third address information signal SOSEB1_F outputted from the selection unit 10 is the same signal as the second address information signal SOSEB1_R or as the inverted second address information signal, so that the second alignment control signal SOSEB1_F<0:3> is substantially same with a signal made by delaying the first alignment control signal SOSEB1_R<0:3> or an inverted first alignment control signal for the half-clock.

As described above, the first alignment control signal SOSEB1_R<0:3> and the second alignment control signal SOSEB1_F<0:3> outputted from the selection unit 10, the first alignment control signal generating unit 20 and the second alignment control signal generating unit 30 is for aligning a sequence of the output data.

Meanwhile, the clock-edge selection signal generating unit 40 has a same structure with the first alignment control signal generating unit 20 as shown in FIGS. 3 and 4 except that the first address information signal SOSEB0 and the first column-cycle information signal SS<0:3> are inputted.

FIG. 8 is a waveform diagram illustrating an operation of the clock-edge selection signal generating unit 40 as shown in FIG. 1.

As shown, first, when the read CAS signal CASP6_RD is activated after the read command is inputted, the LSB of the column address inputted with the read command is applied to the first address information signal SOSEB0 in synchronization with the DLL rising clock RCLK_DLL corresponding to a (RL−1). Then, the first address information signal SOSEB0 is changed by a two-clock unit.

Also, when the read command is inputted, a first bit SS<0> of the first column-cycle information signal SS<0:3> is activated with a logic level 'HIGH' and a second to a fourth bits SS<1:3> of the first column-cycle information signal SS<0:3> are inactivated with a logic level 'LOW'. Then, in synchronization with the DLL falling clock FCLK_DLL corresponding to the (RL−1), the first bit SS<0> of the first column-cycle information signal SS<0:3> is inactivated with the logic level 'LOW' and the second bit SS<1> of the first column-cycle information signal SS<0:3> is activated with the logic level 'HIGH'.

As described above, the first column-cycle information signal SS<0:3> is sequentially activated for a two-clock unit. When the gabless read operation, i.e., the read command is continuously applied, the first column-cycle information signal SS<0:3> keeps on being sequentially activated from the first bit SS<0> to the fourth bit SS<3>.

In detail, the clock-edge selection signal generating unit 40 outputs the first address information signal SOSEB0 as the clock-edge selection signal SOSEB0<0:3> in response to each corresponding first column-cycle information signal SS<0:3>. Namely, when the first bit SS<0> of the first column-cycle information signal SS<0:3> is activated, the first address information signal SOSEB0 is outputted as a first bit SOSEB0<0> of the clock-edge selection signal SOSEB0<0:3>. Also, when the second bit SS<1> of the first column-cycle information signal SS<0:3> is activated, the first address information signal SOSEB0 is outputted as a second bit SOSEB0<1> of the clock-edge selection signal SOSEB0<0:3>. Accordingly, each bit of the clock-edge selection signal SOSEB0<0:3> sequentially has a valid data value by the two-clock unit from the DLL rising clock RCLK_DLL corresponding to the (RL−1).

For reference, in the data output device of the present invention, the clock-edge selection signal SOSEB0<0:3> determines which the first DLL output clock RCLK_DO or the second DLL output clock FCLK_DO is synchronized with the output data.

FIG. 9 is a circuit block diagram depicting the first pipe latch unit 62 as shown in FIG. 1.

Meanwhile, each of the first to the fourth pipe latch units 62, 64, 66 and 68 has a same structure except that which signals are inputted. The first pipe latch unit 62 is explained as an example.

As shown, the first pipe latch unit 62 include an input driving unit 62*a*, a latching unit 62*b*, a data selecting unit 62*c*, a data aligning unit 62*d* and an output driving unit 62*e*.

The input driving unit 62*a* drives the global data GIO_Q<0:3> in response to a first bit PIN<0> of the pipe input control signal PIN<0:3>. The latching unit 62*b* latches outputs of the input driving unit 62*a*. The data selecting unit 62*c* selectively transfers outputs of the latching unit 62*b* as a first pre-pipeline signal PRE_RDO<0:1> and a second pre-pipeline signal PRE_FDO<0:1> in response to the first bit SOSEB0<0> of the clock-edge selection signal SOSEB0<0:3>. The data aligning unit 62*d* aligns a sequence of the first pre-pipeline signal PRE_RDO<0:1> and the second pre-pipeline signal PRE_FDO<0:1> in response to the first bit SOSEB1_R<0> of the first alignment control signal SOSEB1_R<0:3> and the first bit of SOSEB1_F<0> of the second alignment control signal SOSEB1_F<0:3>. The output driving unit 62*e* outputs output signals of the data aligning unit 62*d* in response to a first bit RPOUT<0> of the first pipe output control signal RPOUT<0:3> and a first bit FPOUT<0> of the second pipe output control signal FPOUT<0:3>.

Hereinafter, timings of the pipe input control signal PIN<0:3>, the global data GIO_Q<0:3>, the first pipe output control signal RPOUT<0:3> and the second pipe output control signal FPOUT<0:3> are described as follows.

First, after the read command is inputted, the first bit PIN<0> of the pipe input control signal PIN<0:3> is activated with a logic level 'LOW' in response to the external clock CLK after a delay time corresponding the AL. Then, the first bit PIN<0> is inactivated with a logic level 'HIGH' after two clocks. In this time, a second bit PIN<1> of the pipe input control signal PIN<0:3> is activated, and then the second bit PIN<1> is inactivated two clocks later. Likewise, a third bit PIN<2> of the pipe input control signal PIN<0:3> is activated.

As described above, after the read command is inputted, the pipe input control signal PIN<0:3> is sequentially activated for the two-clock unit after the delay time corresponding the AL.

The global data GIO_Q<0:3> outputted from a memory block corresponds to four bits outputted when four column select lines, corresponding to four column addresses except for the first and the second LSB of the column address inputted together with the read command, are simultaneously activated. Each of the global data GIO_Q<0:3> has a different value by the two-clock unit during a read operation The pipe latch output control unit 50 generates the first and the second pipe output control signal RPOUT<0:3> and FPOUT<0:3> in response to the read CAS signal CASP6_RD. In particular, the first bit RPOUT<0> of the first pipe output control signal RPOUT<0:3> is activated in response to the DLL falling clock FCLK_DLL corresponding to the (RL−1). After two clocks, the first bit RPOUT<0> of the first pipe output control signal RPOUT<0:3> is inactivated and a second bit RPOUT<1> of the first pipe output control signal RPOUT<0:3> is activated. In order word, the first pipe output control signal RPOUT<0:3> is activated by the two-clock unit from the DLL falling clock FCLK_DLL corresponding to the (RL−1). Also, the second pipe output control signal FPOUT<0:3> is activated later than the first pipe output control signal RPOUT<0:3> by the half-clock.

In detail, an operation of the first pipe latch unit 62 is described as follows.

After the read command is inputted, the input driving unit 62*a* in the first pipe latch unit 62 drives the global data GIO_Q<0:3> in response to the first bit PIN<0> of the pipe input control signal PIN<0:3> activated after the delay time corresponding to the AL. The latching unit 62*b* saves the outputs of the input driving unit 62*a*.

The data selecting unit 62*c* selectively transfers the outputs of latching unit 62*b* the in response to the first bit SOSEB0<0> of the clock-edge selection signal SOSEB0<0:3> having the valid data value in synchronization with the DLL rising clock RCLK_DLL corresponding to the (RL−1) after the read command is inputted. As a result, the first pre-pipeline signal PRE_RDO<0:1> and the second pre-pipeline signal PRE_FDO<0:1> are outputted.

The data aligning unit 62d receives the first pre-pipeline signal PRE_RDO<0:1> and the second pre-pipeline signal PRE_FDO<0:1> to thereby align the sequence of the received signals in response to the first bit SOSEB1_R<0> of the first alignment control signal SOSEB1_R<0:3> having the valid data value in synchronization with the DLL falling clock FCLK_DLL corresponding to the (RL−1), and the first bit SOSEB1_F<0> of the second alignment control signal SOSEB1_F<0:3> having the valid data value later than the first pipe output control signal RPOUT<0:3> by the half-clock.

The output driving unit 62e drives the outputs of the data aligning unit 62d to thereby output the first output data RDO and the second output data FDO in response to the first bit RPOUT<0> of the first pipe output control signal RPOUT<0:3> activated in response to the DLL falling clock FCLK_DLL corresponding to the (RL−1), and the first bit FPOUT<0> of the second pipe output control signal FPOUT<0:3> activated later than the first pipe output control signal RPOUT<0:3> by the half-clock.

The process for aligning data in the pipe latch unit 60 is described as the following Table 1.

TABLE 1

| START ADDRESS | 0 SEQUEN | | 1 | | 2 SEQUEN | | 3 |
|---|---|---|---|---|---|---|---|
| MODE (SEQBINT) | & INTER | INTER | SE-QUEN | & INTER | INTER | SE-QUEN | |
| SOSEB0 | 0 | 1 | 1 | 0 | 1 | 1 | |
| PRE_RDO<0> | Q0 | Q1 | Q1 | Q0 | Q1 | Q1 | |
| PRE_RDO<1> | Q2 | Q3 | Q3 | Q2 | Q3 | Q3 | |
| PRE_FDO<0> | Q1 | Q0 | Q0 | Q1 | Q0 | Q0 | |
| PRE_FDO<1> | Q3 | Q2 | Q2 | Q3 | Q2 | Q2 | |
| SOSEB1_R | 0, 1 | 0, 1 | 0, 1 | 1, 0 | 1, 0 | 1, 0 | |
| RDO | Q0, Q2 | Q1, Q3 | Q1, Q3 | Q2, Q0 | Q3, Q1 | Q3, Q1 | |
| SOSEB1_F | 0, 1 | 0, 1 | 1, 0 | 1, 0 | 1, 0 | 0, 1 | |
| FDO | Q1, Q3 | Q0, Q2 | Q2, Q0 | Q3, Q1 | Q2, Q0 | Q0, Q2 | |
| SEQUENCE OF OUTPUT DATA | Q0, Q1, Q2, Q3 | Q1, Q0, Q3, Q2 | Q1, Q2, Q3, Q0 | Q2, Q3, Q0, Q1 | Q3, Q2, Q1, Q0 | Q3, Q0, Q1, Q2 | |

As shown, the Table 1, the sequence of the output data including a 4-bit is classified into six cases according to a start address and the burst-type selection signal SEQBINT. Each bit of the 4-bit output data is divided into a 2-bit data based on the first address information signal SOSEB0 which determines which the DLL rising clock RCLK_DLL or the DLL falling clock FCLK_DLL is synchronized with the output data. Then, each sequence of the 2-bit output data is determined by the first alignment control signal SOSEB1_R<0:3> and the second alignment control signal SOSEB1_F<0:3> to thereby output the 2-bit output data as the first output data RDO and the second output data FDO.

For reference, the six cases denotes two case according to a sequential mode and an interleave mode, and four case according to the start address. Only when the start address is odd, the sequential mode and the interleave mode are classified. As a result, the sequence of the 4-bit output data is largely classified into six cases as shown in Table 1.

In addition, referring to Table 1, a 'SOSEB0' in a first row means the first address information signal SOSEB0, and a 'PRE_RDO<0>', a 'PRE_RDO<1>', a 'PRE_FDO<0>' and a 'PRE_FDO<1>' mean each of the first pre-pipeline signal PRE_RDO<0:1> and the second pre-pipeline signal PRE_FDO<0:1>. A 'SOSEB1_R' means a data value corresponding to the first alignment control signal SOSEB1_R<0:3> and a toggled value thereof in a next clock. A 'RDO' means a sequence for outputting each bit of the first pre-pipeline signal PRE_RDO<0:1> as the first output data RDO based on the 'SOSEB1_R'. In a next row, a 'SOSEB1_F' means a data value corresponding to the second alignment control signal SOSEB1_F<0:3> and a toggled value thereof in a next clock in response to the 'SOSEB1_R' and the burst-type selection signal SEQBINT, i.e., the sequential mode and the interleave mode. A 'FDO' means a sequence for outputting the second pre-pipeline signal PRE_FDO<0:1> as the second output data FDO based on the 'SOSEB1_F'. Finally, a 'SEQUENCE OF OUTPUT DATA' means a sequence which the first output data RDO and the second output data FDO are outputted by the data driving unit 70.

FIG. 10 is a circuit block diagram depicting the data driving unit 70 as shown in FIG. 1.

As shown, the data driving unit 70 includes a second transfer gate T2, a third transfer gate T3 and an output latch unit LAT2.

The second transfer gate T2 transfers the first output data RDO in synchronization with the first DLL output clock RCLK_DO. The third transfer gate T3 transfers the second output data FDO in synchronization with the second DLL output clock FCLK_DO. The output latch unit LAT2 latches outputs of the second transfer gate T2 and the third transfer gate T3 to thereby output the latched signal as the external data DQ.

The data driving unit 70 outputs one of the first output data RDO and the second output data FDO outputted from the pipe latch unit 60 as the external data DQ in response to the first DLL output clock RCLK_DO and the second DLL output clock FCLK_DO.

FIG. 11 is a waveform diagram illustrating an operation of the data output device as shown in FIG. 1.

As shown, first, after the read command is inputted, the pipe input control signal PIN<0:3> is sequentially activated by the two-clock unit after the delay time corresponding the AL. Then, the first to the fourth pipe latch units 62, 64, 66 and 68 latch the global data GIO_Q<0:3> inputted when the corresponding bit of the pipe input control signal PIN<0:3> is activated. In this time, each of the first to the fourth pipe latch units 62, 64, 66 and 68 has a different data value because the data vale is changed every two-clock.

The LSB of the column address inputted together with the read command is applied to the first address information signal SOSEB0 in response to the DLL rising clock RCLK_DLL corresponding to the (RL−1), so that the first address information signal SOSEB0 is changed by two-clock unit. The second LSB of the column address is applied to the second address information signal SOSEB1_R in response to the DLL falling clock FCLK_DLL corresponding to the (RL−1), so that the second address information signal SOSEB1_R is changed by one-clock unit.

The clock-edge selection signal generating unit 40 sequentially generates the clock-edge selection signal SOSEB0<0:3> having the valid data value by the two-clock unit from the DLL rising clock RCLK_DLL corresponding to the (RL−1).

The first alignment control signal generating unit 20 sequentially generates the first alignment control signal SOSEB1_R<0:3> having the valid data value by the two-clock unit from the DLL falling clock FCLK_DLL corresponding to the (RL−1).

The second alignment control signal generating unit 30 generates the second alignment control signal SOSEB1_F<0:3> by delaying the first alignment control signal SOSEB1_R<0:3> or the inverted first alignment control signal for the half-clock.

Continuously, the first to the fourth pipe latch units 62, 64, 66 and 68 latch and transfer the 4-bit output data, which is divided by the 2-bit unit, to the data driving unit 70 in response to the clock-edge selection signal SOSEB0<0:3> having the valid data value in synchronizing with the DLL rising clock RCLK_DLL corresponding to the (RL−1). Then, the first to the fourth pipe latch units 62, 64, 66 and 68 generate the first and the second output data RDO and FDO in synchronization with the first and the second alignment control signals SOSEB1_R<0:3> and SOSEB1_F<0:3>, and the first and the second pipe output control signals RPOUT<0:3> and FPOUT<0:3>. Herein, the first and the second alignment control signals SOSEB1_R<0:3> and SOSEB1_F<0:3> are sequentially activated in synchronization with the DLL rising clock RCLK_DLL and the DLL falling clock FCLK_DLL, each corresponding to the (RL−1).

For example, in case of the first pipe latch unit 62, first, the first pipe latch unit 62 selects one of the 2-bit data in response to the first bit SOSEB1_R<0> of the first alignment control signal SOSEB1_R<0:3> having the valid data value in synchronization with the DLL falling clock FCLK_DLL corresponding to the (RL−1). Then, the first pipe latch unit 62 outputs the first output data RDO in response to the first bit RPOUT<0> of the first pipe output control signal RPOUT<0:3> which is simultaneously activated with the first bit SOSEB1_R<0> of the first alignment control signal SOSEB1_R<0:3>. Also, the first pipe latch unit 62 outputs the second output data FDO in response to the first bit FPOUT<0> of the second pipe output control signal FPOUT<0:3> and the first bit SOSEB1_F<0> of the second alignment control signal SOSEB1_F<0:3> which is activated later than the first bit SOSEB1_R<0> of the first alignment control signal SOSEB1_R<0:3> by the half-clock.

The data driving unit 70 receives the first and the second output data RDO and FDO from the pipe latch unit 60 to thereby output the received data as the external data DQ in synchronization with the DLL rising clock RCLK_DLL and the DLL falling clock FCLK_DLL.

In the mean time, in the above described conventional data output device, during a high-speed operation, a data fail frequently occurs. As a result, the high-speed operation of the semiconductor memory device can be restricted by the data fail of the data output device.

FIG. 12 is a waveform diagram describing a phenomenon which an effective window of the output data is reduced.

As shown, the pipe latch unit 60 outputs the first output data RDO based on the first alignment control signal SOSEB1_R<0:3> and the first pipe output control signal RPOUT<0:3> simultaneously activated with the first alignment control signal SOSEB1_R<0:3>. Likewise, the pipe latch unit 60 outputs the second output data FDO based on the second alignment control signal SOSEB1_F<0:3> and the second pipe output control signal FPOUT<0:3>.

Herein, if any one of the first pipe output control signal RPOUT<0:3> and the first alignment control signal SOSEB1_R<0:3> has a skew, the first pipe output control signal RPOUT<0:3> is not synchronized with the first alignment control signal SOSEB1_R<0:3>. As a result, the effective window of the output data as much as the skew can be reduced. Likewise, if any one of the second pipe output control signal FPOUT<0:3> and the second alignment control signal SOSEB1_F<0:3> has a skew, the second pipe output control signal FPOUT<0:3> is not synchronized with the second alignment control signal SOSEB1_F<0:3>. As a result, the effective window of the output data as much as the skew can be reduced.

As described above, a problem that the effective window of the output data is reduced is deteriorated in the high-speed operation. In addition, in case that the number of pre-patch data is increased, the problem is more deteriorated.

Further, in the conventional data output device, when an operational frequency is increased, a point of inputting the valid data value must be advanced to a point of activating the clock-edge selection signal SOSEB0<0:3>. As a result, it imposes restrictions on the operational frequency.

SUMMARY OF THE INVENTION

It is, therefore, an object of the present invention to provide a data output device of a semiconductor memory device for stably operating in a high frequency circumstance.

In accordance with an aspect of the present invention, there is provided a data output device of the semiconductor memory device, the device including: a selection unit for receiving a second address information signal to directly output or inversely output the received signal as a third address information signal in response to a burst-type selection signal and a first address information signal; a pipe output control unit for generating a plurality of pipe output control signals in response to a read CAS signal; a plurality of pipe latch units for storing a global data in response to a pipe input control signal and aligning the stored data in response to the first to the third address information signals, thereby outputting the aligned data as a first and a second output data which are synchronized by the pipe output control signals; and a data driving unit for receiving the first and the second output data to output the received data as an external data in response to a first and a second DLL output clock.

In accordance with another aspect of the present invention, there is provided a pipe latch device, including: an input alignment unit for receiving and aligning a global data in response to a first to a third address information signal while a corresponding bit of a pipe input control signal having plural bits is activated, and outputting a first and a second rising data, and a first and a second falling data; a multiplicity of latch units for latching the first and the second rising data, and the first and the second falling data; and a plurality of output units for receiving output data of the latch units to output the received data as a first and a second output data in response to a plurality of pipe output control signals containing a first to a fourth pipe output control signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

Figure 1:
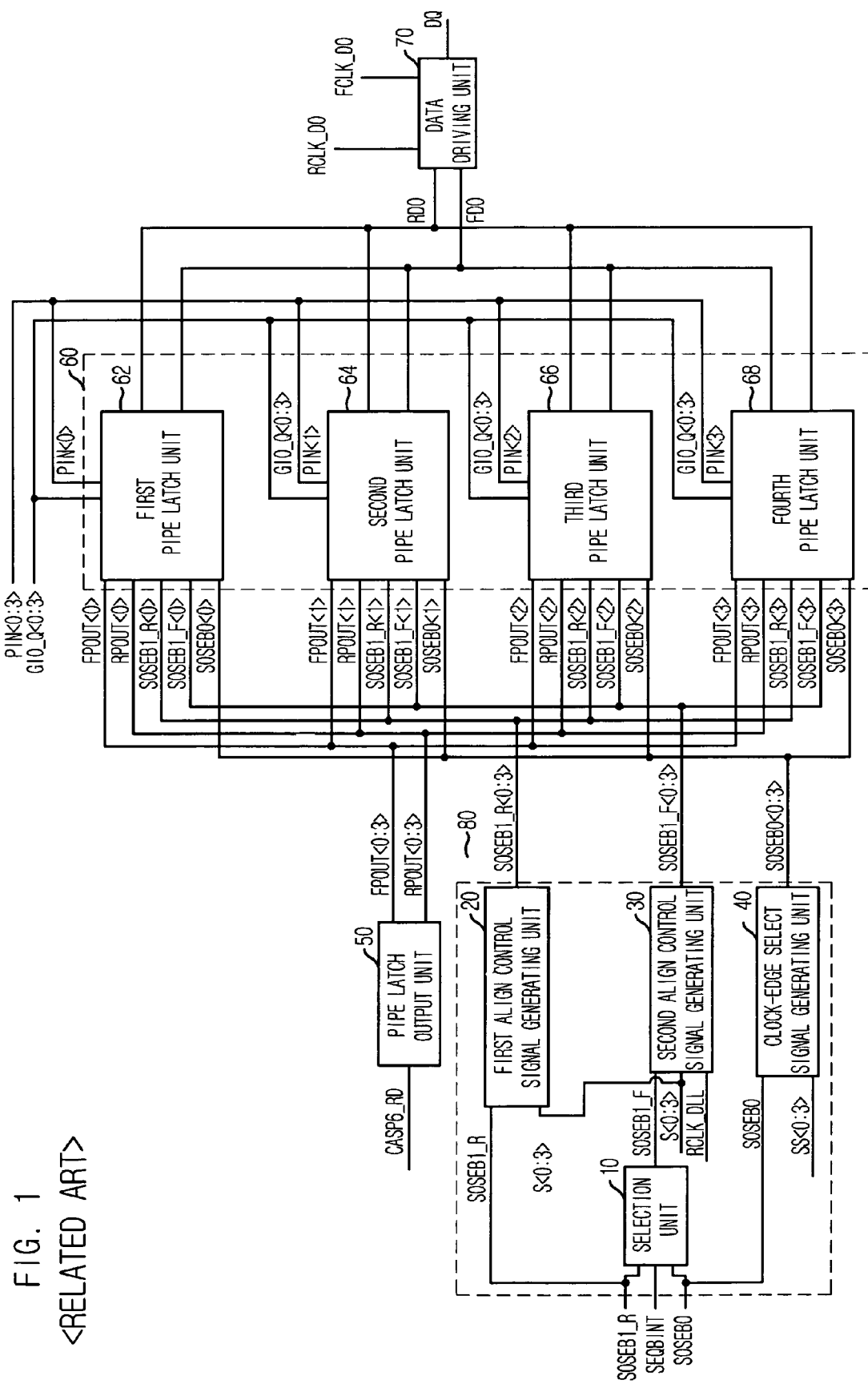
FIG. 1 is a block diagram showing a conventional data output device of a semiconductor memory device.
Figure 2:
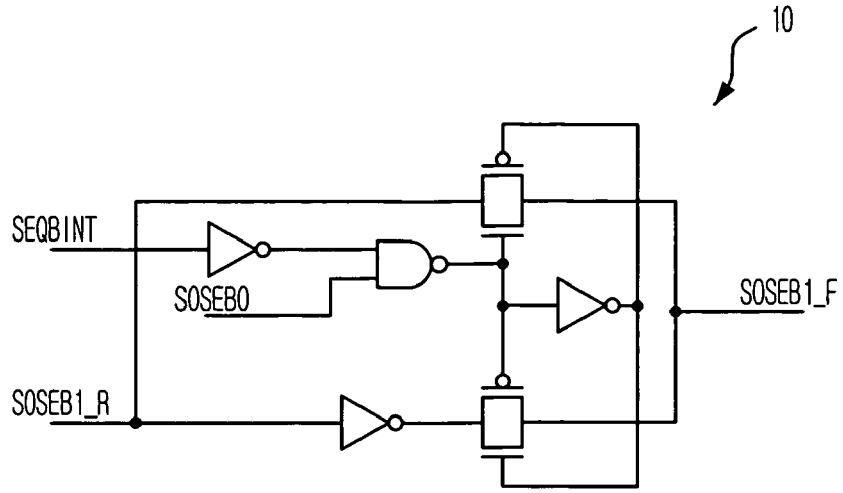
FIG. 2 is a circuit diagram showing a selection unit as shown in FIG. 1.
Figure 3:
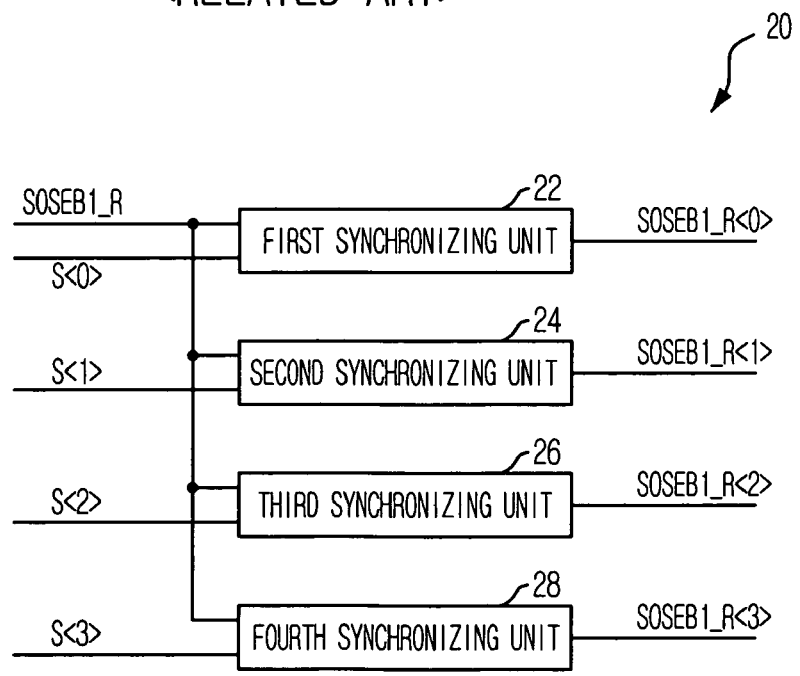
FIG. 3 is a circuit diagram showing a first alignment control signal generating unit as shown in FIG. 1.
Figure 4:
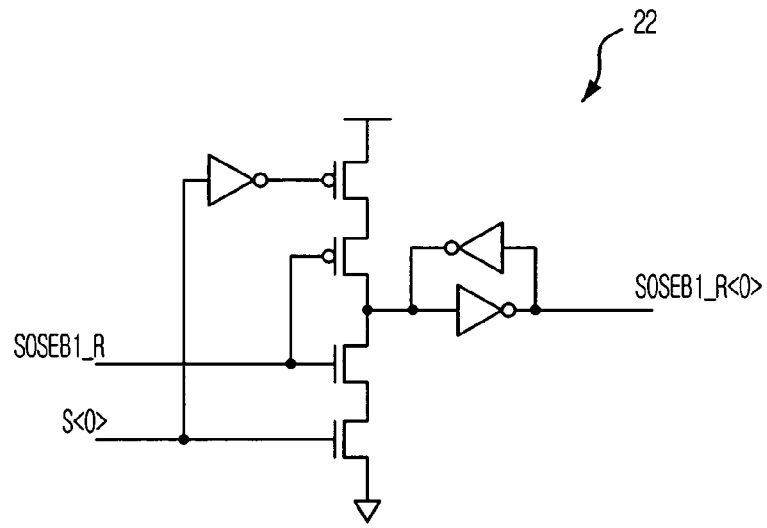
FIG. 4 is a circuit diagram showing a first synchronizing unit as shown in FIG. 3.
Figure 5:
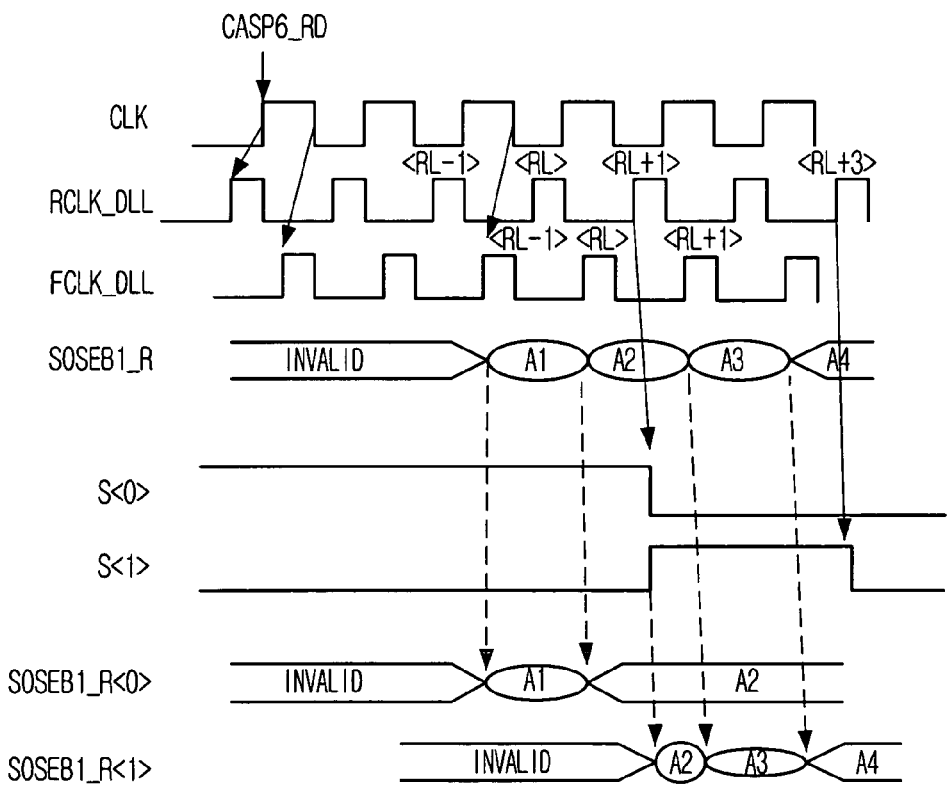
FIG. 5 is a waveform diagram illustrating an operation of the first alignment control signal generating unit shown in FIG. 4.
Figure 6:
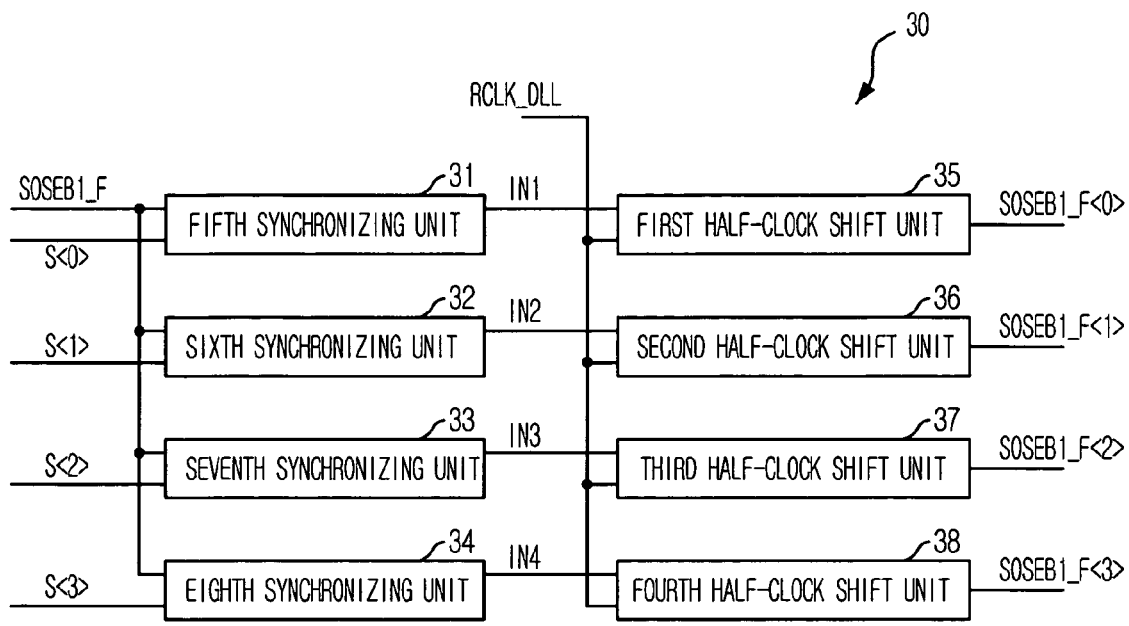
FIG. 6 is a circuit diagram showing a second alignment control signal generating unit as shown in FIG. 1.
Figure 7:
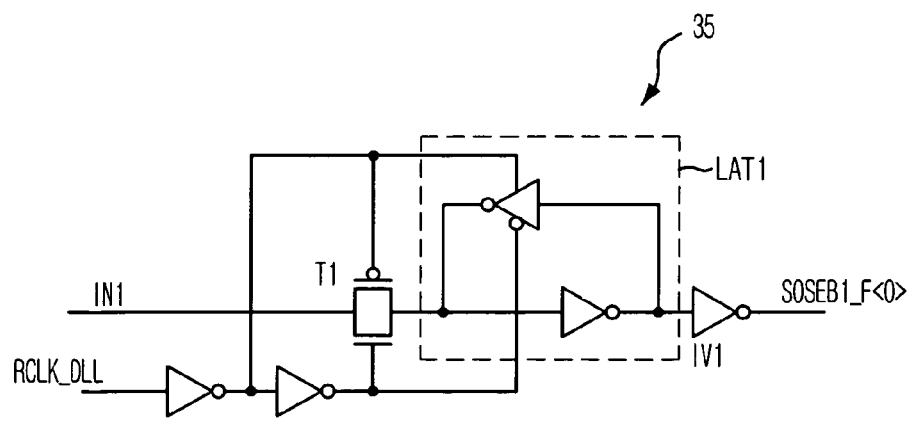
FIG. 7 is a circuit diagram showing a first half-clock shift unit as shown in FIG. 6.
Figure 8:
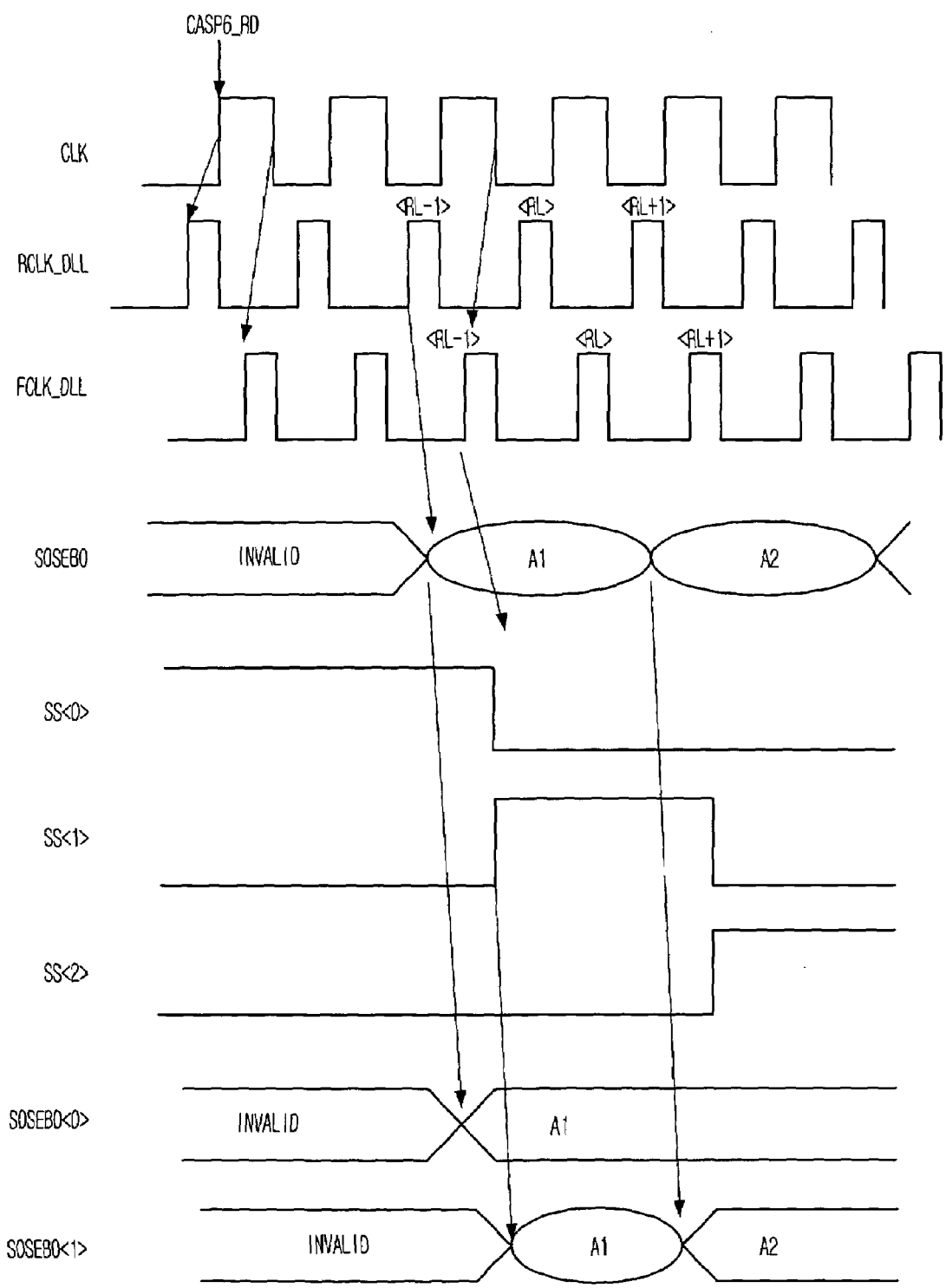
FIG. 8 is a waveform diagram illustrating an operation of a clock-edge selection signal generating unit as shown in FIG. 1.
Figure 9:
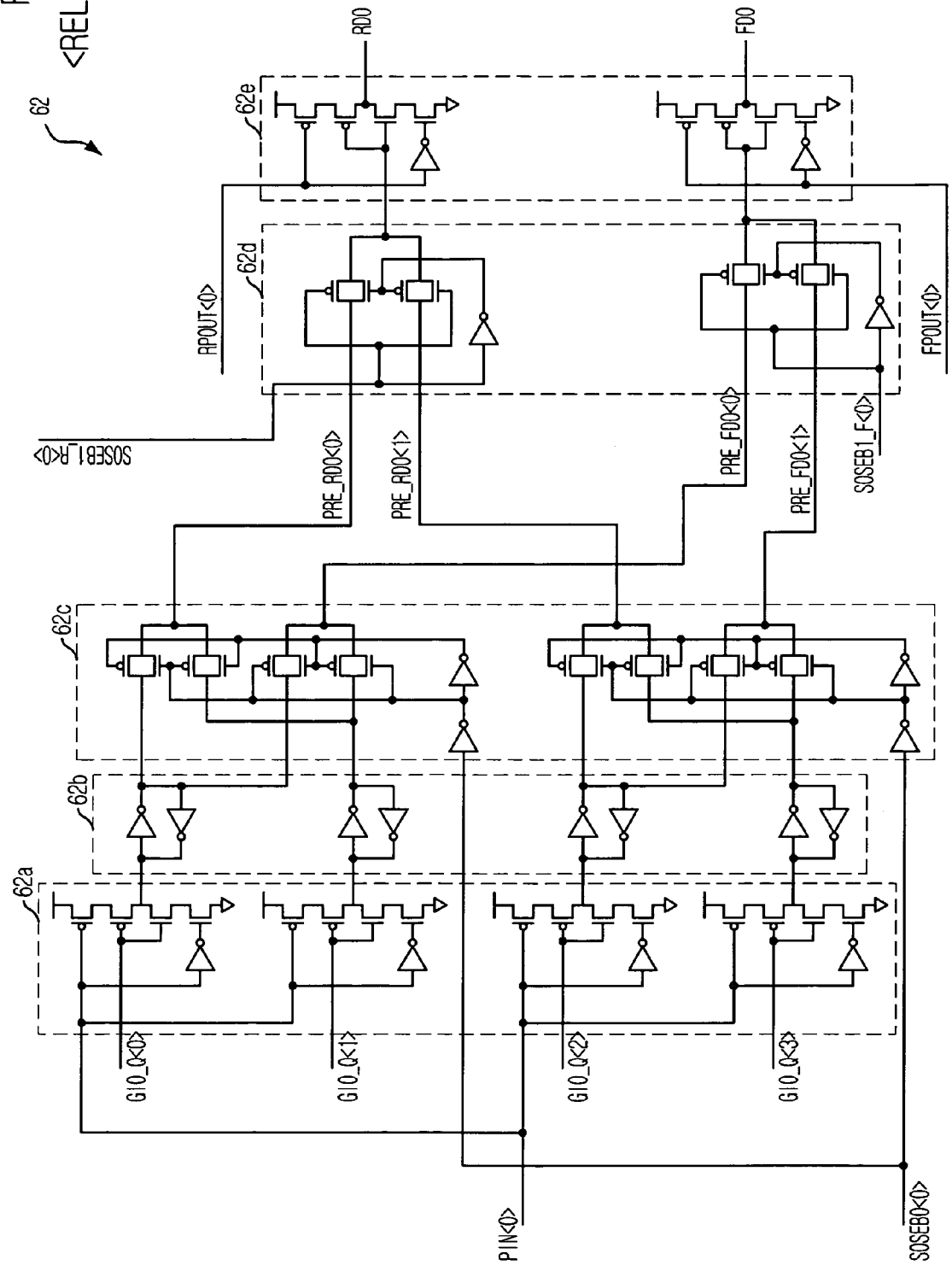
FIG. 9 is a circuit block diagram depicting a first pipe latch unit as shown in FIG. 1.
Figure 10:
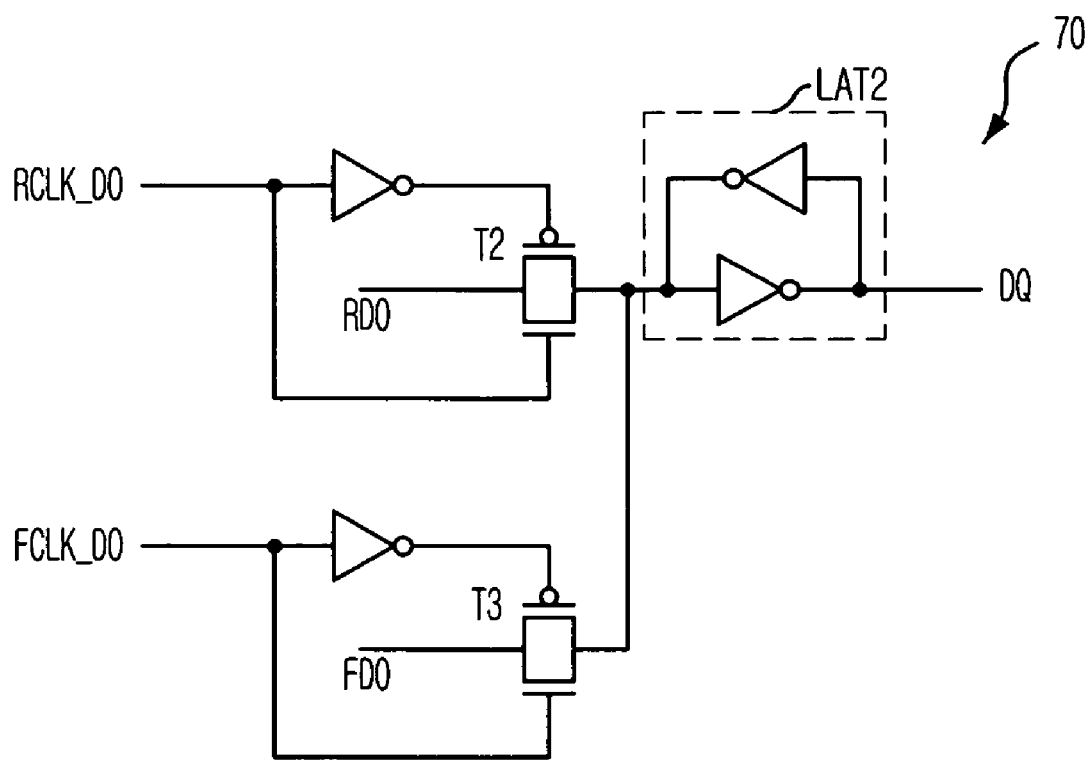
FIG. 10 is a circuit block diagram depicting a data driving unit as shown in FIG. 1.
Figure 11:
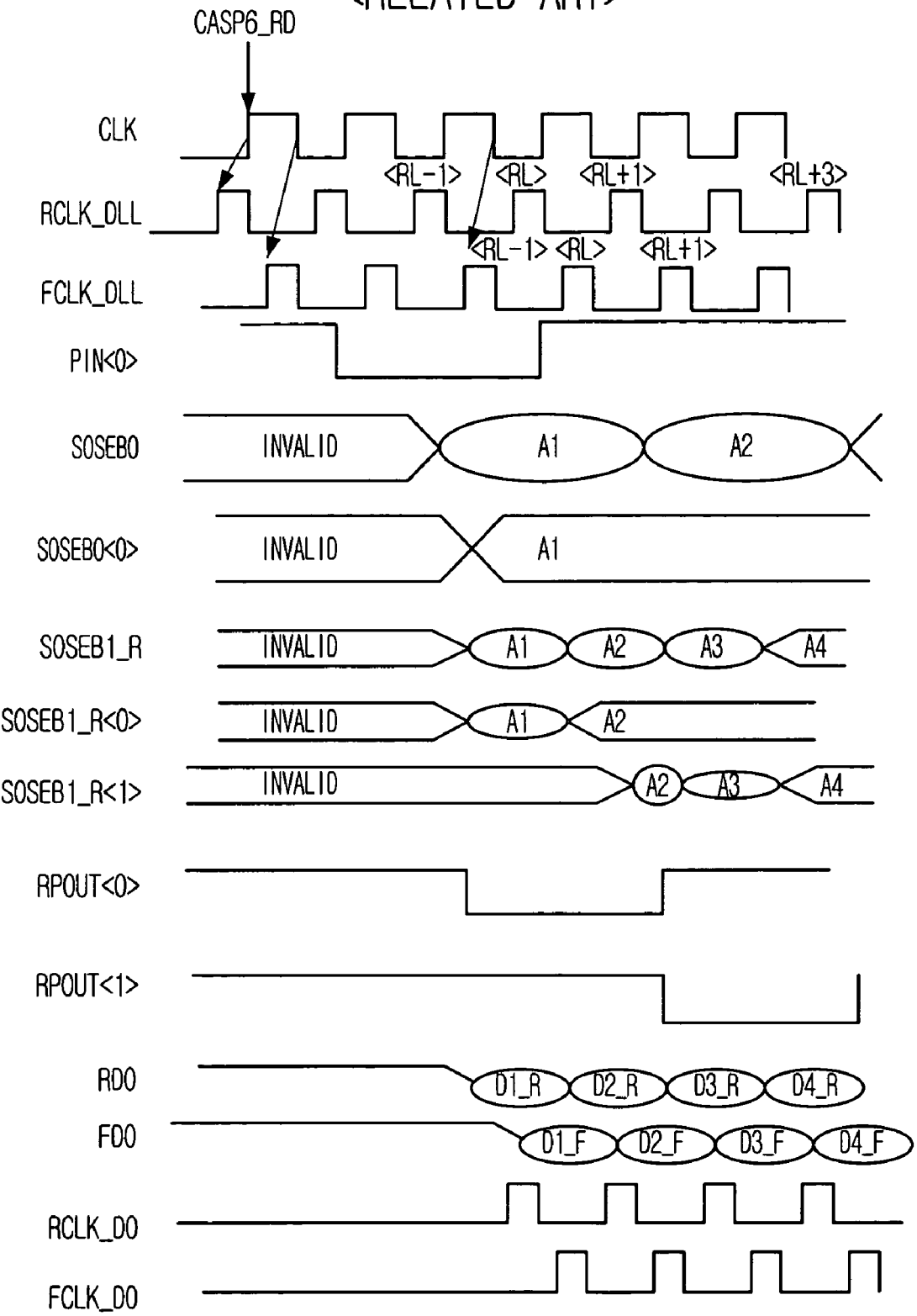
FIG. 11 is a waveform diagram illustrating an operation of the data output device as shown in FIG. 1.
Figure 12:
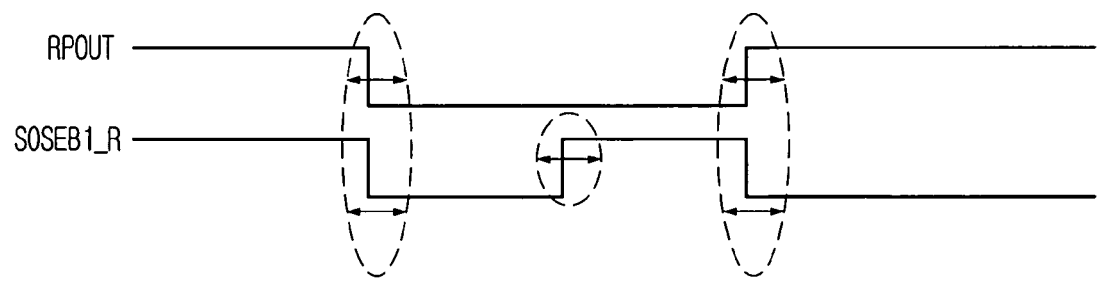
FIG. 12 is a waveform diagram describing a phenomenon which an effective window of the output data is reduced.
Figure 13:
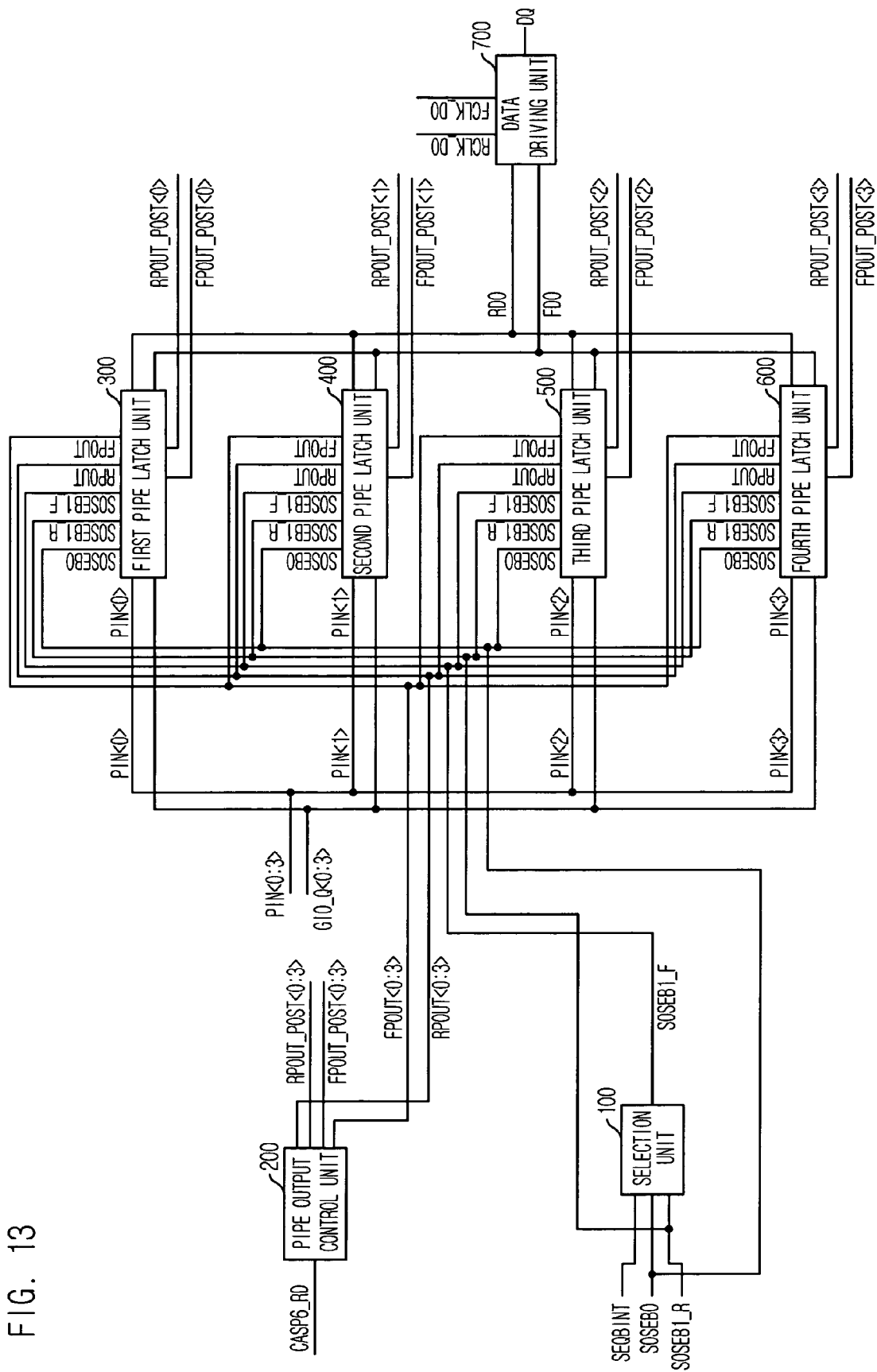
FIG. 13 is a block diagram showing a data output device of a semiconductor memory device in accordance with an embodiment of the present invention.

FIG. 13 is a block diagram showing a data output device of a semiconductor memory device in accordance with an embodiment of the present invention.

As shown, the data output device of the semiconductor memory device in accordance with the embodiment of the present invention includes a selection unit 100, a pipe output control unit 200, a first to a fourth pipe latch units 300, 400, 500 and 600 and a data driving unit 700.

The selection unit 100 receives a second address information signal SOSEB1_R to directly output or inversely output the received signal as a third address information signal SOSEB1_F in response to a burst-type selection signal SEQBINT and a first address information signal SOSEB0.

The pipe output control unit 200 generates a first and a second pipe output control signals RPOUT<0:3> and FPOUT<0:3>, and a first and a second post-pipe output control signals RPOUT_POST<0:3> and FPOUT_POST<0:3> in response to a read CAS signal CASP6_RD.

The first to fourth pipe latch units 300, 400, 500 and 600 save a global data GIO_Q<0:3> in response to a pipe input control signal PIN<0:3> and align the saved data in response to the first to the third address information signals SOSEB0, SOSEB1_R and SOSEB1_F, to thereby output the aligned data as a first and a second output data RDO and FDO in synchronization with the first and the second pipe output control signals RPOUT<0:3> and FPOUT<0:3>, and the first and the second post-pipe output control signals RPOUT_POST<0:3> and FPOUT_POST<0:3>.

The data driving unit 700 receives the first and the second output data RDO and FDO to output the received data as an external data DQ in response to a first and a second DLL output clocks RCLK_DO and FCLK_DO.

Figure 14:
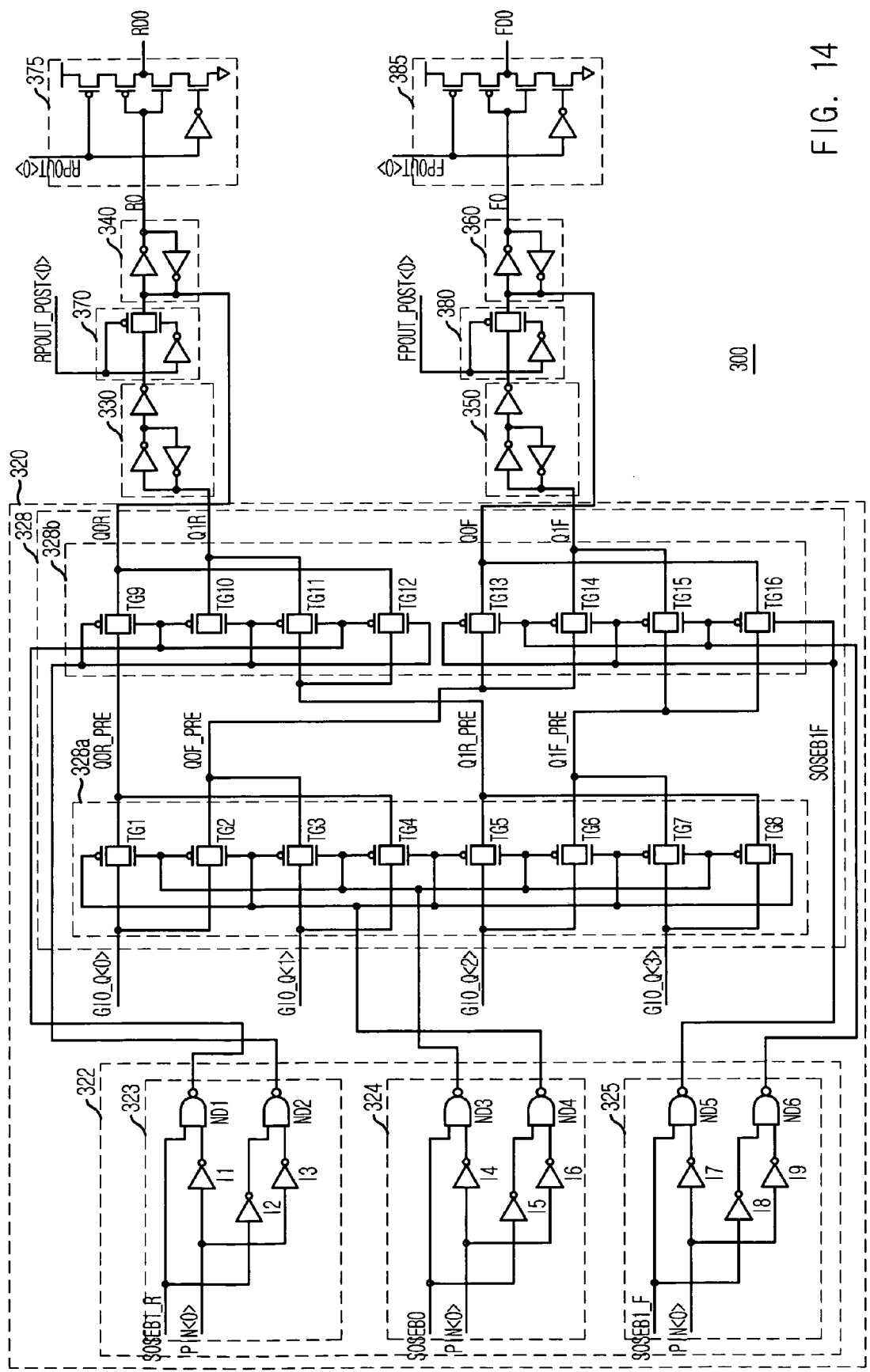
FIG. 14 is a first pipe latch unit as shown in FIG. 13.

FIG. 14 is the first pipe latch unit 300 as shown in FIG. 13. Herein, each of the second to the fourth pipe latch units 400, 500 and 600 has the same structure as the first pipe latch unit 300 as described in FIG. 14.

As shown, the first pipe latch unit 300 includes an input alignment unit 320, a first to a fourth latch units 330, 340, 350 and 360, and a first to a fourth output units 370, 375, 380 and 385. Herein, the input alignment unit 320 receives and aligns the global data GIO_Q<0:3> in response to the first to the third address information signals SOSEB0, SOSEB1_R and SOSEB1_F during a first bit PIN<0> of the pipe input control signal PIN<0:3> having four bits is activated, to thereby output a first and a second rising data Q0R and Q1R, and a first and a second falling data Q0F and Q1F to the first to the fourth latch units 330, 340, 350 and 360. The first to the fourth latch units 330, 340, 350 and 360 latch the first and the second rising data Q0R and Q1R, and the first and the second falling data Q0F and Q1F. The first to the fourth output units 370, 375, 380 and 385 receive outputs of the first to the fourth latch units 330, 340, 350 and 360, to thereby output the received data as the first and the second output data RDO and FDO in response to the first and the second pipe output control signals RPOUT<0:3> and FPOUT<0:3>, and the first and the second post-pipe output control signals RPOUT_POST<0:3> and FPOUT_POST<0:3>.

The input alignment unit 320 includes an alignment control signal generating unit 322 and a data selection unit 328. Herein, the alignment control signal generating unit 322 receives the first to the third address information signals SOSEB0, SOSEB1_R and SOSEB1_F, and the first bit PIN<0> of the pipe input control signal PIN<0:3>, to thereby generate a plurality of alignment control signals. The data selection unit 328 selectively transfers the global data GIO_Q<0:3> to the first to the fourth latch units 330, 340, 350 and 360 in response to the plural alignment control signals.

The alignment control signal generating unit 322 includes a clock-edge selection unit 324, a rising data alignment control signal generating unit 323 and a falling data alignment control signal generating unit 325. Herein, the clock-edge selection unit 324 receives the first address information signal SOSEB0 and the first bit PIN<0> of the pipe input control signal PIN<0:3> to generate a first and a second clock-edge selection signal. The rising data alignment control signal generating unit 323 receives the second address information signal SOSEB1_R and the first bit PIN<0> of the pipe input control signal PIN<0:3> to generate a first and a second rising data alignment control signal. The falling data alignment control signal generating unit 325 receives the third address information signal SOSEB1_F and the first bit PIN<0> of the pipe input control signal PIN<0:3> to generate a first and a second falling data alignment control signal.

The rising data alignment control signal generating unit 323 includes a first inverter I1, a second inverter I2, a third inverter I3, a first NAND gate ND1 and a second NAND gate ND2. Herein, the first inverter I1 inverts the first bit PIN<0> of the pipe input control signal PIN<0:3>. The first NAND gate ND1 performs a NAND operation of an output signal of the first inverter I1 and the second address information signal SOSEB1_R to output the first rising data alignment control signal. The second inverter I2 inverts the second address information signal SOSEB1_R. The third inverter I3 inverts the first bit PIN<0> of the pipe input control signal PIN<0:3>. The second NAND gate ND2 performs a NAND operation of an output signal of the second inverter I2 and an output signal of the third inverter I3 to output the second rising data alignment control signal.

The clock-edge selection unit 324 includes a fourth inverter I4, a fifth inverter I5, a sixth inverter I6, a third NAND gate ND3 and a fourth NAND gate ND4. Herein, the fourth inverter I4 inverts the first bit PIN<0> of the pipe input control signal PIN<0:3>. The third NAND gate ND3 performs a NAND operation of an output signal of the fourth inverter I4 and the first address information signal SOSEB0 to generate the first clock-edge selection signal. The fifth inverter I5 inverts the first address information signal SOSEB0. The sixth inverter I6 inverts the first bit PIN<0> of the pipe input control signal PIN<0:3>. The fourth NAND gate ND4 performs a NAND operation of an output signal of the fifth inverter I5 and an output signal of the sixth inverter I6 to output the second clock-edge selection signal.

The falling data alignment control signal generating unit 325 include a seventh inverter I7, an eighth inverter I8, a ninth inverter I9, a fifth NAND gate ND5 and a sixth NAND gate ND6. Herein, the seventh inverter I7 inverts the first bit PIN<0> of the pipe input control signal PIN<0:3>. The fifth NAND gate ND5 performs a NAND operation of an output signal of the seventh inverter I7 and the third address information signal SOSEB1_F to generate the first falling data alignment control signal. The eighth inverter I8 inverts the third address information signal SOSEB1_F. The ninth inverter I9 inverts the first bit PIN<0> of the pipe input control signal PIN<0:3>. The sixth NAND gate ND6 performs a NAND operation of an output signal of the eighth inverter I8 and an output signal of the ninth inverter I9 to output the second falling data alignment control signal.

The data selection unit 328 includes an edge selection unit 328a and a sequence selection unit 328b. Herein, the edge selection unit 328a receives the global data GIO_Q<0:3> in response to the first and the second clock-edge selection signals, to thereby selectively output a first and a second pre-rising data Q0R_PRE and Q1R_PRE, and a first and a second pre-falling data Q0F_PRE and Q1F_PRE. The sequence selection unit 328b receives the first and the second pre-rising data Q0R_PRE and Q1R_PRE, and the first and the second pre-falling data Q0F_PRE and Q1F_PRE in response to the first and the second rising data alignment control signals and the first and the second falling data alignment control signals, to thereby output the first and the second rising data Q0R and Q1R, and the first and the second falling data Q0F and Q1F.

The edge selection unit 328a includes a first to an eighth transfer gates TG1 to TG8. Herein, when the first clock-edge selection signal is activated and the second clock-edge selection signal is inactivated, the first transfer gate TG1 transfers a first bit GIO_Q<0> of the global data GIO_Q<0:3> as the first pre-rising data Q0R_PRE, the third transfer gate TG3 transfers a second bit GIO_Q<1> of the global data GIO_Q<0:3> as the first pre-falling data Q0F_PRE, the fifth transfer gate TG5 transfers a third bit GIO_Q<2> of the global data GIO_Q<0:3> as the second pre-rising data Q1R_PRE and the seventh transfer gate TG7 transfers a fourth bit GIO_Q<3> of the global data GIO_Q<0:3> as the second pre-falling data Q1F_PRE. Likewise, when the first clock-edge selection signal is inactivated and the second clock-edge selection signal is activated, the second transfer gate TG2 transfers the first bit GIO_Q<0> of the global data GIO_Q<0:3> as the first pre-falling data Q0F_PRE, the fourth transfer gate TG4 transfers the second bit GIO_Q<1> of the global data GIO_Q<0:3> as the first pre-rising data Q0R_PRE, the sixth transfer gate TG6 transfers the third bit GIO_Q<2> of the global data GIO_Q<0:3> as the second pre-falling data Q1F_PRE and the eighth transfer gate TG8 transfers the fourth bit GIO_Q<3> of the global data GIO_Q<0:3> as the second pre-rising data Q1R_PRE.

The sequence selection unit 328b includes a ninth to a sixteenth transfer gates TG9 to TG16. Herein, when the first rising data alignment control signal is activated and the second rising data alignment control signal is inactivated, the ninth transfer gate TG9 transfers the first pre-rising data Q0R_PRE as the first rising data Q0R, the eleventh transfer gate TG11 transfers the second pre-rising data Q1R_PRE as the second rising data Q1R. When the first rising data alignment control signal is inactivated and the second rising data alignment control signal is activated, the tenth transfer gate TG10 transfers the first pre-rising data Q0R_PRE as the second rising data Q1R, the twelfth transfer gate TG12 transfers the second pre-rising data Q1R_PRE as the first rising data Q0R. When, the first falling data alignment control signal is inactivated and the second falling data alignment control signal is activated, the thirteenth transfer gate TG13 transfers the first pre-falling data Q0F_PRE as the first falling data Q0F, the fifteenth transfer gate TG15 transfers the second pre-falling data Q1F_PRE as the second falling data Q1F. When the first falling data alignment control signal is activated and the second falling data alignment control signal is inactivated, the fourteenth transfer gate TG14 transfers the first pre-falling data Q0F_PRE as the second falling data Q1F, the sixteenth transfer gate TG16 transfers the second pre-falling data Q1F_PRE as the first falling data Q0F.

The first latch unit 330 saves the second rising data Q1R, the second latch unit 340 saves the first rising data Q0R, the third latch unit 350 saves the second falling data Q1F and the fourth latch unit 360 saves the first falling data Q0F.

The first output unit 370 includes a seventh transfer gate TG17 for transferring an output of the first latch unit 330 to the second latch unit 340 in response to a first bit RPOUT_POST<0> of the first post-pipe output control signal RPOUT_POST<0:3>. The second output unit 375 includes a first driver for receiving an output of the second latch unit 340 to thereby output the received signal as the first output data RDO in response to a first bit RPOUT<0> of the first pipe output control signal RPOUT<0:3>.

The third output unit 380 includes an eighteenth transfer gate TG18 for transferring an output of the third latch unit 350 to the fourth latch unit 360 in response to a first bit FPOUT_POST<0> of the second post-pipe output control signal FPOUT_POST<0:3>. The fourth output unit 385 includes a second driver for receiving an output of the fourth latch unit 360 to thereby output the received signal as the second output data FDO in response to a first bit FPOUT<0> of the second pipe output control signal FPOUT<0:3>.

Figure 15:
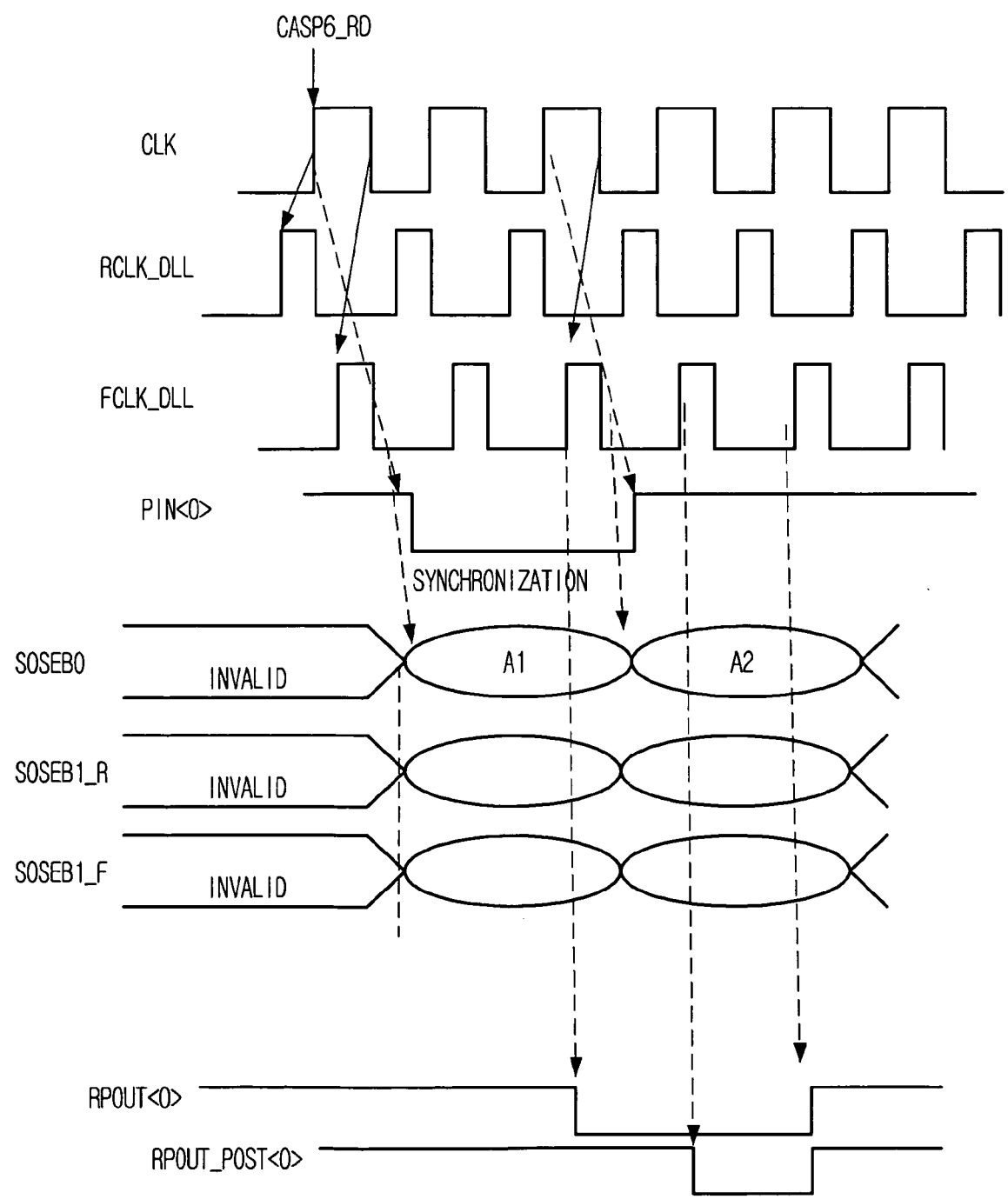
FIG. 15 is a waveform diagram illustrating an operation of the data output device shown in FIGS. 13 and 14.

FIG. 15 is a waveform diagram illustrating an operation of the data output device shown in FIGS. 13 and 14.

For reference, in accordance with the embodiment of the present invention, it is assumed that an AL is set to 0, a CL is set to 3, and a BL is set to 8.

As shown, first, when the read CAS signal CASP6_RD is activated after the read command is inputted, the pipe input control signal PIN<0:3>, the first address information signal SOSEB0 and the second address information signal SOSEB1_R have valid data values so that the third address information signal SOSEB1_F, which is generated by the selection unit 100 based on the second address information signal SOSEB1_R, has a valid data value.

Then, the first to fourth pipe latch units 300, 400, 500 and 600 are activated in response to the corresponding bit of the pipe input control signal PIN<0:3>, which is sequentially activated. The first to fourth pipe latch units 300, 400, 500 and 600 align the inputted global data GIO_Q<0:3> based on the first address information signal SOSEB0, the second address information signal SOSEB1_R and the third address information signal SOSEB1_F, to thereby output the aligned data in response to the first and the second post-pipe output control signal RPOUT_POST<0:3> and FPOUT_POST<0:3>, and the first and the second pipe output control signal RPOUT<0:3> and FPOUT<0:3>.

In particularly, the first pipe latch unit 300 is explained as an example of the first to fourth pipe latch units 300, 400, 500 and 600. Each bit of the inputted global data GIO_Q<0:3> is aligned by the edge selection unit 328a and the sequence selection unit 328b based on the first and the second clock-edge selection signals outputted from the clock-edge selection unit 324, the first and the second rising data alignment control signals outputted from the rising data alignment control signal generating unit 323, and the first and the second falling data alignment control signals outputted from the falling data alignment control signal generating unit 325. The aligned data are outputted as the first and the second rising data Q0R and Q1R, and the first and the second falling data Q0F and Q1F. Then, the first and the second rising data Q0R and Q1R, and the first and the second falling data Q0F and Q1F are saved at a corresponding one of the first to the fourth latch units 330, 340, 350 and 360 as shown in FIG. 14.

Continuously, the second output unit 375 outputs the output of the second latch unit 340 as the first output data RDO in response to the first bit RPOUT<0> of the first pipe output control signal RPOUT<0:3> activated with a logic level 'LOW' in synchronization with a DLL falling clock FCLK_DLL corresponding to a (RL−1). The first output unit 370 transfers the output of the first latch unit 330 to the second latch unit 340 in response to the first bit RPOUT_POST<0> of the first post-pipe output control signal RPOUT_POST<0:3> activated after one clock, so that the transferred data is outputted as the first output data RDO via the second output unit 375.

As not shown in FIG. 15, the first bit FPOUT<0> of the second pipe output control signal FPOUT<0:3> is activated in synchronization with a DLL rising clock RCLK_DLL corresponding to the RL. The third output unit 380 transfers the output of the third latch unit 350 to the fourth latch unit 360 in response to the first bit FPOUT_POST<0> of the second post-pipe output control signal FPOUT_POST<0:3> activated after one clock, so that the transferred data is outputted as the second output data FDO via the fourth output unit 385.

The process for aligning data in the first pipe latch unit 300 is described as the following Table 2.

TABLE 2

| START ADDRESS | 0 SE-QUEN | | 1 | | 2 SE-QUEN | | 3 |
| --- | --- | --- | --- | --- | --- | --- | --- |
| MODE (SEQBINT) | & INTER | INTER | SE-QUEN | & INTER | INTER | SE-QUEN | |
| SOSEB0 | 0 | 1 | 1 | 0 | 1 | 1 | |
| Q0R_PRE | Q0 | Q1 | Q1 | Q0 | Q1 | Q1 | |
| Q1R_PRE | Q2 | Q3 | Q3 | Q2 | Q3 | Q3 | |
| Q0F_PRE | Q1 | Q0 | Q0 | Q1 | Q0 | Q0 | |

TABLE 2-continued

| START ADDRESS | 0 SE-QUEN | | 1 | | 2 SE-QUEN | | 3 |
| --- | --- | --- | --- | --- | --- | --- | --- |
| MODE (SEQBINT) | & INTER | INTER | SE-QUEN | & INTER | INTER | SE-QUEN | |
| Q1F_PRE | Q3 | Q2 | Q2 | Q3 | Q2 | Q2 | |
| SOSEB1_R | 0 | 0 | 0 | 1 | 1 | 1 | |
| R0 | Q0, Q2 | Q1, Q3 | Q1, Q3 | Q2, Q0 | Q3, Q1 | Q3, Q1 | |
| SOSEB1_F | 0 | 0 | 1 | 1 | 1 | 0 | |
| F0 | Q1, Q3 | Q0, Q2 | Q2, Q0 | Q3, Q1 | Q2, Q0 | Q0, Q2 | |
| SEQUENCE OF OUTPUT DATA | Q0, Q1, Q2, Q3 | Q1, Q0, Q3, Q2 | Q1, Q2, Q3, Q0 | Q2, Q3, Q0, Q1 | Q3, Q2, Q1, Q0 | Q3, Q0, Q1, Q2 | |

Hereinafter, operations of the conventional data output device and the data output device according to the present invention are described as follows.

To begin with, the conventional data output device includes the data align control unit 80 having the selection unit 10, the first alignment control signal generating unit 20, the second alignment control signal generating unit 30 and the clock-edge selection signal generating unit 40. On the other hand, the data output device of the present invention includes the selection unit 100. Herein, the selection unit 100 is similar structure with the selection unit 10. The reason is that the first to the fourth pipe latch units 300, 400, 500 and 600 recognizes the first and the second address information signal SOSEB0 and SOSEB1_R as a valid data value when the pipe input control signal PIN<0:3> is activated. As a result, the data output device in the present invention does not need the first alignment control signal generating unit 20, the second alignment control signal generating unit 30 and the clock-edge selection signal generating unit 40 for generating a plurality of control signals having plural bits sequentially activated by the two-clock unit.

Further, the first to the fourth pipe latch units 300, 400, 500 and 600 of the present invention have a different structure with the conventional pipe latch unit 60. The conventional pipe latch unit 60 latches the global data GIO_Q<0:3> in synchronization with the pipe input control signal PIN<0:3> to thereby align the latched data in time of outputting. On the other hand, the first to the fourth pipe latch units 300, 400, 500 and 600 of the present invention align the global data GIO_Q<0:3> according to a clock edge and a data sequence in time of inputting, to thereby save the aligned data in the corresponding latch unit. Herein, the clock edge is selected based on the first address information signal SOSEB0, and the data sequence is selected based on the second and the third address information signals SOSEB1_R and SOSEB1_F.

As described above, in the present invention, the first to the fourth pipe latch units 300, 400, 500 and 600 of the data output device output the saved data in the corresponding latch unit in synchronization with the first and the second pipe output control signal RPOUT<0:3> and FPOUT<0:3>. Therefore, in the present invention, the problem that the effective window of the output data corresponding to the skew is reduced can not be occurred because the skew between the first pipe output control signal RPOUT<0:3> and the first alignment control signal SOSEB1_R<0:3>, or the skew between the second pipe output control signal FPOUT<0:3> and the second alignment control signal SOSEB1_F<0:3> is not generated.

Figure 16:
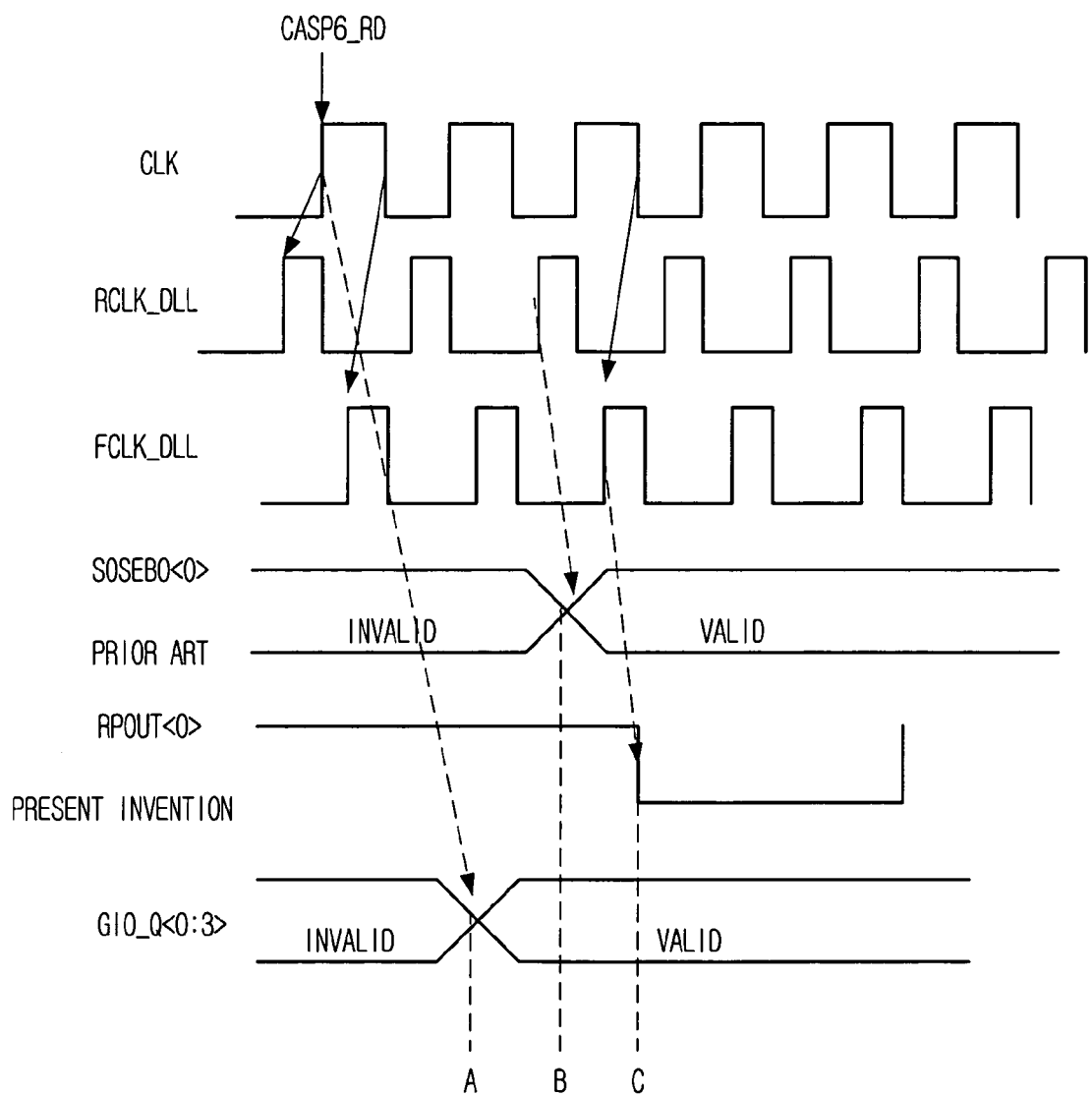
FIG. 16 is a timing diagram showing operations of the conventional data output device and the data output device according to the present invention.

FIG. 16 is a timing diagram showing operations of the conventional data output device and the data output device according to the present invention.

Herein, an 'A' point means a time when the global data GIO_Q<0:3> has a valid data value. A 'B' point means a time when the first bit SOSEB0<0> of the clock-edge selection signal SOSEB0<0:3> has a valid data value. A 'C' point means a time when the first bit RPOUT<0> of the first pipe output control signal RPOUT<0:3> has a valid data value. As shown in FIG. 16, the 'B' point is advanced to the 'C' point by a half-clock.

In the conventional data output device, for a normal operation, the global data GIO_Q<0:3> should have the valid data value before the first bit SOSEB0<0> of the clock-edge selection signal SOSEB0<0:3> has the valid data value.

In the present invention, for a normal operation, the global data GIO_Q<0:3> should have the valid data value before the first bit RPOUT<0> of the first pipe output control signal RPOUT<0:3> has the valid data value.

In this time, even if a frequency of a clock CLK is increased, each of the point 'B' and the point 'c' is not advanced to the point 'A' so as not to occur a data fail. Accordingly, the data output device of the present invention has an advantageous effect by the half-clock.

As described above, in the present invention, the effective window of the output data is not reduced because of the skews, so that it is possible to stably operate in a high frequency circumstance.

The present application contains subject matter related to Korean patent application No. KR 2005-91652, filed in the Korean Intellectual Property Office on Sep. 29, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A data output device of the semiconductor memory device, comprising:
    a selection unit for receiving a second address information signal to directly output or inversely output the received signal as a third address information signal in response to a burst-type selection signal and a first address information signal;
    a pipe output control unit for generating a plurality of pipe output control signals in response to a read CAS signal;
    a plurality of pipe latch units for storing a global data in response to a pipe input control signal and aligning the stored data in response to the first to the third address information signals, thereby outputting the aligned data as a first and a second output data which are synchronized by the pipe output control signals; and
    a data driving unit for receiving the first and the second output data to output the received data as an external data in response to a first and a second DLL output clock.

2. The data output device as recited in claim 1, wherein each of the pipe latch units includes:
    an input alignment unit for receiving and aligning the global data in response to the first to the third address information signals while a corresponding bit of the pipe input control signal having plural bits is activated, and outputting a first and a second rising data, and a first and a second falling data;
    a multiplicity of latch units for latching the first and the second rising data, and the first and the second falling data; and
    a plurality of output units for receiving output data of the latch units to output the received data as the first and the second output data in response to the plurality of the pipe output control signals containing a first to a fourth pipe output control signal.

3. The data output device as recited in claim 2, wherein the input alignment unit includes:
    an alignment control signal generating unit for receiving the first to the third address information signals and the corresponding bit of the pipe input control signal to thereby generate a plurality of alignment control signals containing a first to a sixth alignment control signal; and
    a data selection unit for selectively transferring the global data to the plurality of the latch units in response to the plurality of the alignment control signals.

4. The data output device as recited in claim 3, wherein the alignment control signal generating unit includes:
    a clock-edge selection unit for receiving the first address information signal and the corresponding bit of the pipe input control signal to thereby generate the first and the second alignment control signals;
    a rising data alignment control signal generating unit for receiving the second address information signal and the corresponding bit of the pipe input control signal to thereby generate the third and the fourth alignment control signals; and
    a falling data alignment control signal generating unit for receiving the third address information signal and the corresponding bit of the pipe input control signal to thereby generate the fifth and the sixth alignment control signals.

5. The data output device as recited in claim 4, wherein the rising data alignment control signal generating unit includes:
    a first inverter for inverting the corresponding bit of the pipe input control signal;
    a first NAND gate for performing a NAND operation of an output of the first inverter and the second address information signal to thereby output the third alignment control signal;
    a second inverter for inverting the second address information signal;
    a third inverter for inverting the corresponding bit of the pipe input control signal; and
    a second NAND gate for performing a NAND operation of an output of the second inverter and that of the third inverter to output the fourth alignment control signal.

6. The data output device as recited in claim 4, wherein the clock-edge selection unit includes:
    a first inverter for inverting the corresponding bit of the pipe input control signal;
    a first NAND gate for performing a NAND operation of an output of the first inverter and the first address information signal to thereby generating the first alignment control signal;
    a second inverter for inverting the first address information signal;
    a third inverter for inverting the corresponding bit of the pipe input control signal; and
    a second NAND gate for performing a NAND operation of an output of the second inverter and that of the third inverter to thereby output the second alignment control signal.

7. The data output device as recited in claim 4, wherein the falling data alignment control signal generating unit includes:
- a first inverter for inverting the corresponding bit of the pipe input control signal;
- a first NAND gate for performing a NAND operation of an output of the first inverter and the third address information signal to thereby generate the fifth alignment control signal;
- a second inverter for inverting the third address information signal;
- a third inverter for inverting the corresponding bit of the pipe input control signal; and
- a second NAND gate for performing a NAND operation of an output of the second inverter and that of the third inverter to thereby output the sixth alignment control signal.

8. The data output device as recited in claim 3, wherein the data selection unit includes:
- an edge selection unit for receiving the global data in response to the first and the second alignment control signals and selectively outputting a first and a second pre-rising data, and a first and a second pre-falling data; and
- a sequence selection unit for receiving the first and the second pre-rising data, and the first and the second pre-falling data in response to the third to the sixth alignment control signals and outputting the first and the second rising data, and the first and the second falling data based on the first and the second pre-rising data, and the first and the second pre-falling data.

9. The data output device as recited in claim 8, wherein the edge selection unit has:
- a first transfer gate for transferring a first bit of the global data as the first pre-rising data in case that the first alignment control signal is activated and the second alignment control signal is inactivated;
- a second transfer gate for transferring the first bit of the global data as the first pre-falling data in case that the first alignment control signal is inactivated and the second alignment control signal is activated;
- a third transfer gate for transferring a second bit of the global data as the first pre-falling data in case that the first alignment control signal is activated and the second alignment control signal is inactivated;
- a fourth transfer gate for transferring the second bit of the global data as the first pre-rising data in case that the first alignment control signal is inactivated and the second alignment control signal is activated;
- a fifth transfer gate for transferring a third bit of the global data as the second pre-rising data in case that the first alignment control signal is activated and the second alignment control signal is inactivated;
- a sixth transfer gate for transferring the third bit of the global data as the second pre-falling data in case that the first alignment control signal is inactivated and the second alignment control signal is activated;
- a seventh transfer gate for transferring a fourth bit of the global data as the second pre-falling data in case that the first alignment control signal is activated and the second alignment control signal is inactivated; and
- an eighth transfer gate for transferring the fourth bit of the global data as the second pre-rising data in case that the first alignment control signal is inactivated and the second alignment control signal is activated.

10. The data output device as recited in claim 8, wherein the sequence selection unit has:
- a first transfer gate for transferring the first pre-rising data as the first rising data in case that the third alignment control signal is activated and the fourth alignment control signal is inactivated;
- a second transfer gate for transferring the first pre-rising data as the second rising data in case that the third alignment control signal is inactivated and the fourth alignment control signal is activated;
- a third transfer gate for transferring the second pre-rising data as the second rising data in case that the third alignment control signal is activated and the fourth alignment control signal is inactivated;
- a fourth transfer gate for transferring the second pre-rising data as the first rising data in case that the third alignment control signal is inactivated and the fourth alignment control signal is activated;
- a fifth transfer gate for transferring the first pre-falling data as the first falling data in case that the fifth alignment control signal is inactivated and the sixth alignment control signal is activated;
- a sixth transfer gate for transferring the first pre-falling data as the second falling data in case that the fifth alignment control signal is activated and the sixth alignment control signal is inactivated;
- a seventh transfer gate for transferring the second pre-falling data as the second falling data in case that the fifth alignment control signal is inactivated and the sixth alignment control signal is activated; and
- an eighth transfer gate for transferring the second pre-falling data as the first falling data in case that the fifth alignment control signal is activated and the sixth alignment control signal is inactivated.

11. The data output device as recited in claim 3, wherein the multiplicity of the latch units include:
- a first latch unit for storing the second rising data;
- a second latch unit for storing the first rising data;
- a third latch unit for storing the second falling data; and
- a fourth latch unit for storing the first falling data.

12. The data output device as recited in claim 11, wherein the plurality of the output units include:
- a first output unit including a first transfer gate for transferring an output of the first latch unit to the second latch unit in response to a corresponding bit of the first pipe output control signal;
- a second output unit including a first driver for receiving an output of the second latch unit to thereby output the received signal as the first output data in response to a corresponding bit of the second pipe output control signal;
- a third output unit including a second transfer gate for transferring an output of the third latch unit to the fourth latch unit in response to a corresponding bit of the third pipe output control signal; and
- a fourth output unit including a second driver for receiving an output of the fourth latch unit to thereby output the received signal as the second output data in response to a corresponding bit of the fourth pipe output control signal.

13. A pipe latch device, comprising:
- an input alignment unit for receiving and aligning a global data in response to a first to a third address information signal while a corresponding bit of a pipe input control signal having plural bits is activated, and outputting a first and a second rising data, and a first and a second falling data;

a multiplicity of latch units for latching the first and the second rising data, and the first and the second falling data; and a plurality of output units for receiving output data of the latch units to output the received data as a first and a second output data in response to a plurality of pipe output control signals containing a first to a fourth pipe output control signal.

14. The pipe latch device as recited in claim 13, wherein the input alignment unit includes:
    an alignment control signal generating unit for receiving the first to the third address information signals and the corresponding bit of the pipe input control signal to thereby generate a plurality of alignment control signals containing a first to a sixth alignment control signal; and
    a data selection unit for selectively transferring the global data to the multiplicity of the latch units in response to the plurality of the alignment control signals.

15. The pipe latch device as recited in claim 14, wherein the alignment control signal generating unit includes:
    a clock-edge selection unit for receiving the first address information signal and the corresponding bit of the pipe input control signal to thereby generate the first and the second alignment control signals;
    a rising data alignment control signal generating unit for receiving the second address information signal and the corresponding bit of the pipe input control signal to thereby generate the third and the fourth alignment control signals; and
    a falling data alignment control signal generating unit for receiving the third address information signal and the corresponding bit of the pipe input control signal to thereby generate the fifth and the sixth alignment control signals.

16. The pipe latch device as recited in claim 15, wherein the data selection unit includes:
    an edge selection unit for receiving the global data in response to the first and the second alignment control signals and selectively outputting a first and a second pre-rising data, and a first and a second pre-falling data; and
    a sequence selection unit for receiving the first and the second pre-rising data, and the first and the second pre-falling data in response to the third to the sixth alignment control signals and outputting the first and the second rising data, and the first and the second falling data based on the first and the second pre-rising data, and the first and the second pre-falling data.

17. The pipe latch device as recited in claim 16, wherein the edge selection unit has:
    a first transfer gate for transferring a first bit of the global data as the first pre-rising data in case that the first alignment control signal is activated and the second alignment control signal is inactivated;
    a second transfer gate for transferring the first bit of the global data as the first pre-falling data in case that the first-alignment control signal is inactivated and the second alignment control signal is activated;
    a third transfer gate for transferring a second bit of the global data as the first pre-falling data in case that the first alignment control signal is activated and the second alignment control signal is inactivated;
    a fourth transfer gate for transferring the second bit of the global data as the first pre-rising data in case that the first alignment control signal is inactivated and the second alignment control signal is activated;
    a fifth transfer gate for transferring a third bit of the global data as the second pre-rising data in case that the first alignment control signal is activated and the second alignment control signal is inactivated;
    a sixth transfer gate for transferring the third bit of the global data as the second pre-falling data in case that the first alignment control signal is inactivated and the second alignment control signal is activated;
    a seventh transfer gate for transferring a fourth bit of the global data as the second pre-falling data in case that the first alignment control signal is activated and the second alignment control signal is inactivated; and
    an eighth transfer gate for transferring the fourth bit of the global data as the second pre-rising data in case that the first alignment control signal is inactivated and the second alignment control signal is activated.

18. The pipe latch device as recited in claim 17, wherein the sequence selection unit has:
    a first transfer gate for transferring the first pre-rising data as the first rising data in case that the third alignment control signal is activated and the fourth alignment control signal is inactivated;
    a second transfer gate for transferring the first pre-rising data as the second rising data in case that the third alignment control signal is inactivated and the fourth alignment control signal is activated;
    a third transfer gate for transferring the second pre-rising data as the second rising data in case that the third alignment control signal is activated and the fourth alignment control signal is inactivated;
    a fourth transfer gate for transferring the second pre-rising data as the first rising data in case that the third alignment control signal is inactivated and the fourth alignment control signal is activated;
    a fifth transfer gate for transferring the first pre-falling data as the first falling data in case that the fifth alignment control signal is inactivated and the sixth alignment control signal is activated;
    a sixth transfer gate for transferring the first pre-falling data as the second falling data in case that the fifth alignment control signal is activated and the sixth alignment control signal is inactivated;
    a seventh transfer gate for transferring the second pre-falling data as the second falling data in case that the fifth alignment control signal is inactivated and the sixth alignment control signal is activated; and
    an eighth transfer gate for transferring the second pre-falling data as the first falling data in case that the fifth alignment control signal is activated and the sixth alignment control signal is inactivated.

19. The pipe latch device as recited in claim 18, wherein the multiplicity of the latch units include:
    a first latch unit for storing the second rising data;
    a second latch unit for storing the first rising data;
    a third latch unit for storing the second falling data; and
    a fourth latch unit for storing the first falling data.

20. The pipe latch device as recited in claim 19, wherein the plurality of the output units include:
    a first output unit including a first transfer gate for transferring an output of the first latch unit to the second latch unit in response to a corresponding bit of the first pipe output control signal;
    a second output unit including a first driver for receiving an output of the second latch unit to thereby output the received signal as the first output data in response to a corresponding bit of the second pipe output control signal;

a third output unit including a second transfer gate for transferring an output of the third latch unit to the fourth latch unit in response to a corresponding bit of the third pipe output control signal; and a fourth output unit including a second driver for receiving an output of the fourth latch unit to thereby output the received signal as the second output data in response to a corresponding bit of the fourth pipe output control signal.

* * * * *